US012588359B2

(12) United States Patent
Kim et al.

(10) Patent No.: US 12,588,359 B2
(45) Date of Patent: Mar. 24, 2026

(54) DISPLAY PANEL AND ELECTRONIC APPARATUS INCLUDING THE SAME

(71) Applicant: Samsung Display Co., Ltd., Yongin-si (KR)

(72) Inventors: Daesuk Kim, Yongin-si (KR); Yanghee Kim, Yongin-si (KR); Hyunchol Bang, Yongin-si (KR); Youngsoo Yoon, Yongin-si (KR); Ilgoo Youn, Yongin-si (KR); Bongwon Lee, Yongin-si (KR); Soyoung Lee, Yongin-si (KR); Sukyo Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 694 days.

(21) Appl. No.: 17/979,693

(22) Filed: Nov. 2, 2022

(65) Prior Publication Data

US 2023/0255058 A1     Aug. 10, 2023

(30) Foreign Application Priority Data

Feb. 9, 2022    (KR) ........................ 10-2022-0017159

(51) Int. Cl.
*H01L 27/32*        (2006.01)
*H10D 86/40*        (2025.01)
(Continued)

(52) U.S. Cl.
CPC ....... *H10K 59/1213* (2023.02); *H10D 86/441* (2025.01); *H10D 86/481* (2025.01);
(Continued)

(58) Field of Classification Search
CPC ........... H10K 59/1213; H10K 59/1216; H10K 59/131; H10K 59/65; H10K 59/121;
(Continued)

(56) References Cited

U.S. PATENT DOCUMENTS 7,227,312 B2    6/2007  Kwak et al.
10,923,546 B2   2/2021  Park et al.
(Continued)

FOREIGN PATENT DOCUMENTS

CN        111916486 A    11/2020
KR      10-0579195 B1    5/2006
(Continued)

*Primary Examiner* — Elmito Breval
(74) *Attorney, Agent, or Firm* — Womble Bond Dickinson (US) LLP

(57)        ABSTRACT

A display panel may include a transmissive area, a display area around the transmissive area, a plurality of light-emitting diodes in the display area, and a plurality of sub-pixel circuits electrically connected to the plurality of light-emitting diodes, respectively, and in the display area. Each of the sub-pixels may include a switching transistor electrically connected to a scan line that extends in a first direction, and electrically connected to a data line that extends in a second direction crossing the first direction, a driving transistor electrically connected to the switching transistor, a storage capacitor electrically connected to the driving transistor, and a conductive line extending in the first direction across a first sub-pixel arranged close to the transmissive area. The conductive line may be electrically connected to a voltage line passing across the first sub-pixel circuit.

33 Claims, 20 Drawing Sheets

(51) Int. Cl.
| | |
|---|---|
| *H10D 86/60* | (2025.01) |
| *H10K 59/121* | (2023.01) |
| *H10K 59/131* | (2023.01) |
| *H10K 59/65* | (2023.01) |

(52) U.S. Cl.
CPC ......... *H10D 86/60* (2025.01); *H10K 59/1216* (2023.02); *H10K 59/131* (2023.02); *H10K 59/65* (2023.02)

(58) Field of Classification Search
CPC .... H10K 59/35; H10K 50/805; H10K 59/124; H10D 86/441; H10D 86/481; H10D 86/60; H10D 86/423
See application file for complete search history.

(56) References Cited

U.S. PATENT DOCUMENTS

| | | | |
|---|---|---|---|
| 10,957,757 | B2 | 3/2021 | Youn et al. |
| 11,024,693 | B2 | 6/2021 | Cho et al. |
| 11,043,551 | B2 | 6/2021 | Shin et al. |
| 2020/0013849 | A1 | 1/2020 | Kim et al. |
| 2020/0058728 | A1* | 2/2020 | Song .................. H10K 59/1315 |
| 2020/0098843 | A1 | 3/2020 | Jeon et al. |
| 2021/0083038 | A1 | 3/2021 | Jeon et al. |
| 2021/0210590 | A1 | 7/2021 | Youn et al. |
| 2021/0280648 | A1 | 9/2021 | Choi et al. |
| 2022/0069047 | A1 | 3/2022 | Yang et al. |

FOREIGN PATENT DOCUMENTS

| | | |
|---|---|---|
| KR | 10-2017-0066767 A | 6/2017 |
| KR | 10-2017-0114026 A | 10/2017 |
| KR | 10-2018-0015019 A | 2/2018 |
| KR | 10-2018-0058265 A | 6/2018 |
| KR | 10-2018-0108271 A | 10/2018 |
| KR | 10-2019-0110170 A | 9/2019 |
| KR | 10-2020-0034902 A | 4/2020 |
| KR | 10-2020-0066498 A | 6/2020 |
| KR | 10-2021-0032598 A | 3/2021 |

* cited by examiner

FIG. 3

DISPLAY PANEL AND ELECTRONIC APPARATUS INCLUDING THE SAME

CROSS-REFERENCE TO RELATED APPLICATION

This application claims priority to and the benefit of Korean Patent Application No. 10-2022-0017159, filed on Feb. 9, 2022, in the Korean Intellectual Property Office, the entire disclosure of which is incorporated by reference herein.

BACKGROUND

1. Field

Aspects of one or more embodiments of the present disclosure relate to a display panel and an electronic apparatus including the same.

2. Description of the Related Art

In a display panel such as an organic light-emitting display panel, thin-film transistors are arranged in a display area to control brightness and the like of light-emitting diodes. The thin-film transistors are configured to control corresponding light-emitting diodes so that the light emitting diodes emit light of a preset color according to a data signal, a driving voltage, and/or a common voltage applied thereto.

Data driving circuits, driving voltage supply lines, common voltage supply lines, and/or the like are arranged in a non-display area outside the display area to provided data signals, driving voltages, common voltages, and/or the like to the thin-film transistors.

SUMMARY

One or more embodiments of the present disclosure include a display apparatus, which may provide high-quality images, and an electronic apparatus including the display apparatus. However, the purpose of the present disclosure is not limited thereto.

Additional aspects will be set forth in part in the description that follows and, in part, will be apparent from the description or may be learned by practicing the embodiments of the present disclosure.

According to one or more embodiments of the present disclosure, a display panel includes a transmissive area, a display area around the transmissive area, a plurality of light-emitting diodes in the display area, a plurality of sub-pixel circuits electrically connected to the plurality of light-emitting diodes, respectively, and located in the display area, wherein each of the plurality of sub-pixel circuits includes a switching transistor electrically connected to a scan line that extends in a first direction, and a data line that extends in a second direction crossing the first direction, a driving transistor electrically connected to the switching transistor, and a storage capacitor electrically connected to the driving transistor, and a conductive line extending in the first direction across a first sub-pixel circuit arranged closer to the transmissive area than other sub-pixel circuits of the plurality of sub-pixel circuits, wherein the conductive line is electrically connected to a voltage line passing across the first sub-pixel circuit.

In one or more embodiments, the voltage line may include a horizontal driving voltage line extending in the first direction across the first sub-pixel circuit.

In one or more embodiments, the conductive line may be on (or at) a same layer as the horizontal driving voltage line, and may be connected as one body (e.g., an integrated body) to the horizontal driving voltage line.

In one or more embodiments, the display panel may further include a first organic insulating layer on the storage capacitor, wherein the voltage line and the horizontal driving voltage line may be on (or at) the first organic insulating layer.

In one or more embodiments, a connection portion of the conductive line and the horizontal driving voltage line may be adjacent to the transmissive area.

The conductive line may be on (or at) a layer different from a layer on (or at) which the voltage line is located.

In one or more embodiments, the storage capacitor may include a first capacitor electrode and a second capacitor electrode, wherein the first capacitor electrode overlaps a driving semiconductor of the driving transistor, and the second capacitor electrode overlaps the first capacitor electrode and is over the first capacitor electrode, and wherein the voltage line may include an electrode voltage line extending in the first direction, and a portion of the electrode voltage line may be the second capacitor electrode.

In one or more embodiments, the display panel may further include a conductive metal between a portion of the conductive line and a portion of the electrode voltage line, wherein the portion of the conductive line may be electrically connected to the portion of the electrode voltage line by the conductive metal.

In one or more embodiments, the voltage line may include a vertical driving voltage line extending in the second direction across the first sub-pixel circuit.

In one or more embodiments, the display panel may further include a first organic insulating layer between the conductive line and the vertical driving voltage line, wherein the conductive line may be on (or at) the first organic insulating layer, and the vertical driving voltage line may be under the first organic insulating layer.

In one or more embodiments, the conductive line may be connected to the vertical driving voltage line through a contact hole in the first organic insulating layer near the transmissive area.

According to one or more embodiments of the present disclosure, an electronic apparatus includes a display panel including a transmissive area and a display area around the transmissive area, and a component below a rear surface of the display panel and corresponding to the transmissive area. The display panel includes a plurality of light-emitting diodes in the display area, a plurality of sub-pixel circuits electrically connected to the plurality of light-emitting diodes, respectively, and arranged in the display area, wherein each of the plurality of sub-pixel circuits includes a switching transistor electrically connected to a scan line that extends in a first direction, and a data line that extends in a second direction crossing the first direction, a driving transistor electrically connected to the switching transistor, and a storage capacitor electrically connected to the driving transistor and including a first capacitor electrode and a second capacitor electrode, and a conductive line extending in the first direction across a first sub-pixel circuit arranged closer to the transmissive area than other sub-pixel circuits of the plurality of sub-pixel circuits, wherein the conductive line is electrically connected to a voltage line passing across the first sub-pixel circuit.

In one or more embodiments, the display panel may include a horizontal driving voltage line extending in the first direction and passing across the first sub-pixel circuit, a vertical driving voltage line extending in the second direction and passing across the first sub-pixel circuit, and an electrode voltage line extending in the first direction and including the second capacitor electrode of the storage capacitor.

In one or more embodiments, the horizontal driving voltage line may cross a portion of the vertical driving voltage line, and the vertical driving voltage line may cross a portion of the electrode voltage line.

In one or more embodiments, the horizontal driving voltage line may be connected to the vertical driving voltage line through a contact hole in an insulating layer between the horizontal driving voltage line and the vertical driving voltage line, and the vertical driving voltage line may be connected to the electrode voltage line through a contact hole in an insulating layer between the vertical driving voltage line and the electrode voltage line.

In one or more embodiments, the voltage line may include the horizontal driving voltage line, and the conductive line may be on (or at) a same layer as the horizontal driving voltage line and connected as one body (e.g., an integrated body) with the horizontal driving voltage line.

In one or more embodiments, a connection portion of the conductive line and the horizontal driving voltage line may be adjacent to the transmissive area.

In one or more embodiments, the voltage line may include the electrode voltage line.

In one or more embodiments, the display panel may further include a conductive metal between a portion of the conductive line and a portion of the electrode voltage line, wherein the portion of the conductive line may be electrically connected to the portion of the electrode voltage line by the conductive metal.

In one or more embodiments, the voltage line may include the vertical driving voltage line.

In one or more embodiments, the conductive line may be connected to the vertical driving voltage line through a contact hole in an insulating layer between the conductive line and the vertical driving voltage line near the transmissive area.

In one or more embodiments, the component may include a sensor or a camera.

According to one or more embodiments of the present disclosure, an electronic apparatus includes a display panel including a transmissive area and a display area around the transmissive area, and a component below a rear surface of the display panel and corresponding to the transmissive area, wherein the display panel includes a plurality of light-emitting diodes in the display area, a plurality of sub-pixel circuits electrically connected to the plurality of light-emitting diodes, respectively, and located in the display area, wherein each of the plurality of sub-pixel circuits includes a switching transistor electrically connected to a scan line that extends in a first direction, and a data line that extends in a second direction crossing the first direction, a driving transistor electrically connected to the switching transistor, and a storage capacitor electrically connected to the driving transistor and including a first capacitor electrode and a second capacitor electrode, two conductive lines on (or at) two opposite sides of the transmissive area, respectively, and apart from each other, and two voltage lines on (or at) two opposite sides of the transmissive area, respectively, and apart from each other, wherein the two conductive lines are electrically connected to the two voltage lines, respectively.

In one or more embodiments, a first conductive line of the two conductive lines on (or at) one side of the transmissive area may pass across a first sub-pixel circuit that is nearer the transmissive area than other sub-pixel circuits of the plurality of sub-pixel circuits, and a first voltage line electrically connected to the first conductive line may pass across the first sub-pixel circuit in the first direction or in the second direction.

In one or more embodiments, the display panel may include a horizontal driving voltage line extending in the first direction and passing across the first sub-pixel circuit, a vertical driving voltage line extending in the second direction and passing across the first sub-pixel circuit, and an electrode voltage line extending in the first direction and including the second capacitor electrode of the storage capacitor.

In one or more embodiments, the horizontal driving voltage line may cross a portion of the vertical driving voltage line, and the vertical driving voltage line may cross a portion of the electrode voltage line.

In one or more embodiments, the horizontal driving voltage line may be connected to the vertical driving voltage line through a contact hole in an insulating layer between the horizontal driving voltage line and the vertical driving voltage line, and the vertical driving voltage line may be connected to the electrode voltage line through a contact hole in another insulating layer between the vertical driving voltage line and the electrode voltage line.

In one or more embodiments, the first voltage line may include the horizontal driving voltage line, and the first conductive line may be on (or at) a same layer as the horizontal driving voltage line and connected as one body (e.g., an integrated body) to the horizontal driving voltage line.

In one or more embodiments, the first voltage line may include the electrode voltage line.

In one or more embodiments, the display panel may further include a conductive metal between a portion of the first conductive line and a portion of the electrode voltage line, wherein the portion of the first conductive line may be electrically connected to the portion of the electrode voltage line by the conductive metal.

In one or more embodiments, the first voltage line may include the vertical driving voltage line.

In one or more embodiments, the first conductive line may be connected to the vertical driving voltage line through a contact hole in an insulating layer between the first conductive line and the vertical driving voltage line near the transmissive area.

In one or more embodiments, the component may include a sensor or a camera.

BRIEF DESCRIPTION OF THE DRAWINGS

The above and other aspects, features, and/or principles of the embodiments of the present disclosure will be more apparent from the following description taken in conjunction with the accompanying drawings, in which:

FIG. 3 is a schematic plan view of a display panel according to one or more embodiments of the present disclosure;

DETAILED DESCRIPTION

Figure 1A:
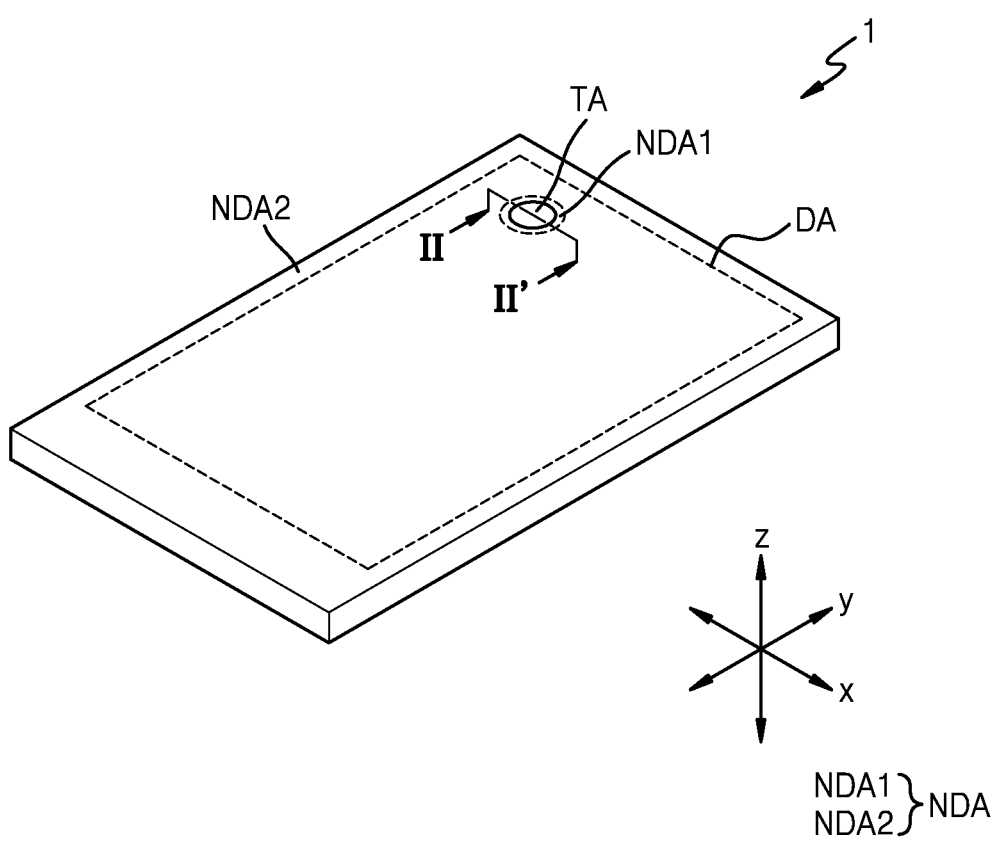
FIGS. 1A and 1B are schematic perspective views of an electronic apparatus according to one or more embodiments of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, with references to the figures, to explain aspects of the present disclosure and will fully convey the aspects and features of the present disclosure to those skilled in the art. Accordingly, processes, elements, and techniques that are not necessary to those having ordinary skill in the art for a complete understanding of the aspects and features of the present disclosure may not have been described.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the present disclosure, and methods for achieving them will be clarified with reference to the embodiments described in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

As used herein, when various elements such as a layer, a region, a plate, and the like are described as "on," "connected to," or "coupled to" another element or layer, not only may the elements be directly on, connected to, or coupled to the other element or layer, but one or more intervening elements or layers may be present. In addition, it will also be understood that when an element or layer is referred to as being "between" two elements or layers, it can be the only element or layer between the two elements or layers, or one or more intervening elements or layers may also be present. In addition, sizes of elements in the drawings may be exaggerated or reduced for convenience of explanation. As an example, the size and thickness of each element shown in the drawings are arbitrarily represented for convenience of description, and thus, the present disclosure is not necessarily limited thereto.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The X-axis, the Y-axis and the Z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 1B:
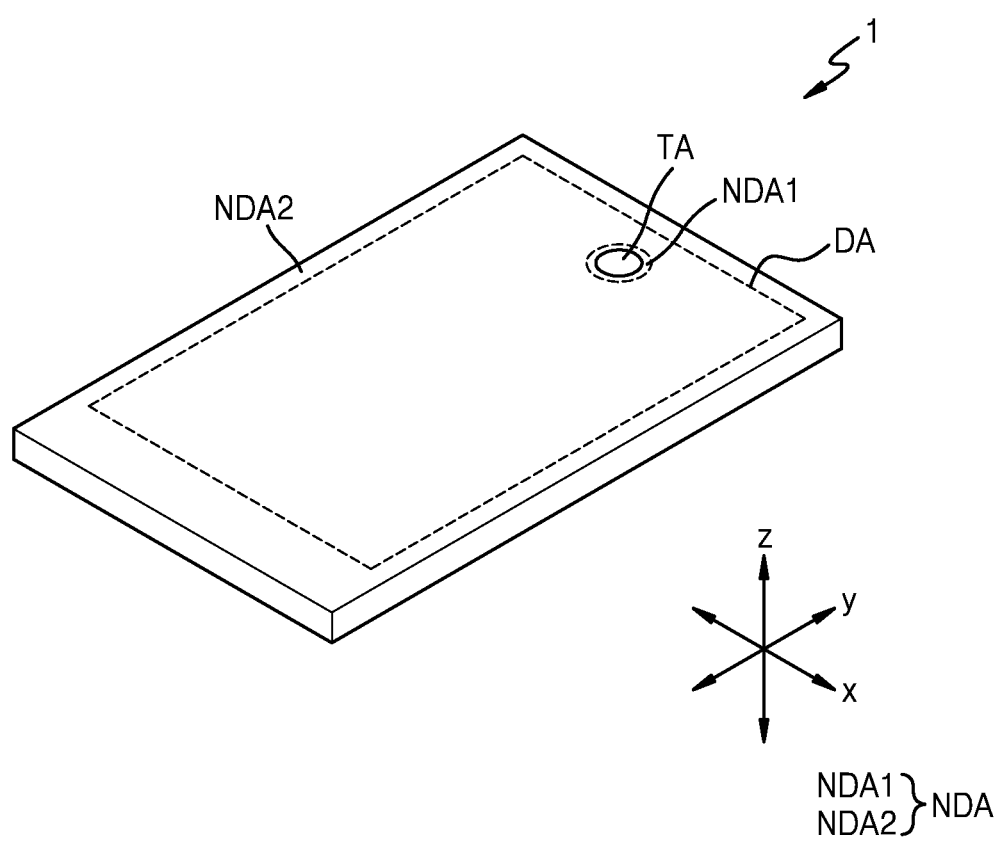

FIGS. 1A and 1B are schematic perspective views of an electronic apparatus 1 according to one or more embodiments of the present disclosure.

Referring to FIGS. 1A and 1B, the electronic apparatus 1 may include an apparatus for displaying moving images and/or still images and may be used as a display screen of various products including televisions, notebook computers, monitors, advertisement boards, Internet of things (IoT), as well as portable electronic apparatuses including mobile phones, smart phones, tablet personal computers (PCs), mobile communication terminals, electronic organizers, electronic books, portable multimedia players (PMPs), navigation systems, and ultra-mobile personal computers (UMPCs). In addition, the electronic apparatus 1 may be used in wearable devices including smartwatches, watch-phones, glasses-type displays, and/or head-mounted displays (HMDs). In addition, in one or more embodiments, the electronic apparatus 1 may be used as an instrument panel for automobiles, center fascias for automobiles, or center information displays (CID) arranged on (or at) a dashboard, room mirror displays that replace side mirrors of automobiles, and/or displays arranged on (or at) the rear surface of front seats as an entertainment for back seats of automobiles. Hereinafter, for convenience of description, one or more embodiments in which the electronic apparatus 1 is used as a smartphone is shown.

In a plan view of the present specification, "left," "right," "up," and "down" denote directions when the electronic apparatus 1 is viewed in a direction perpendicular to the electronic apparatus 1 (e.g., in a z direction). As an example, "left" denotes a −x direction, "right" denotes a +x direction, "up" denotes a +y direction, and "down" denotes a −y direction.

The electronic apparatus 1 may have a rectangular shape in a plan view. As an example, as shown in FIGS. 1A and 1B, the electronic apparatus 1 may have a quadrangular shape having short sides in the x direction and long sides in the y direction in the plan view. A corner where the short side in the x direction meets the long side in the y direction may be round and have a suitable curvature (e.g., a preset curvature), or may be formed to have a right angle. A planar shape of the electronic apparatus 1 is not limited to a rectangle, but may be another shape, such as that of a polygon, ellipse, and/or an irregular shape.

The electronic apparatus 1 may include at least one transmissive area TA arranged inside a display area DA. Though FIGS. 1A and 1B show one transmissive area TA, the electronic apparatus 1 may include two or more transmissive areas TA. The transmission area TA may be surrounded entirely by (or may be around) the display area DA in the plan view. The transmissive area TA is a region in which a component below with reference to FIG. 2 is arranged. The electronic apparatus 1 may have various functions by using the component.

Though it is shown in FIG. 1A that the transmissive area TA is arranged on (or at) the upper left side, embodiments of the present disclosure are not limited thereto. In other embodiments, the transmissive area TA may be arranged on (or at) the upper center as shown in FIG. 1B. Alternatively, in one or more embodiments, the transmissive area TA may be arranged on (or at) the upper right side, or arranged on (or at) the center of the display area DA. However, the present disclosure is not limited thereto, and the transmissive area TA may be located at any of various positions.

The display area DA may be configured to display images by using light emitted from a plurality of sub-pixels arranged in the display area DA. Each sub-pixel may include a display element that emits light of a desired color (e.g., a preset color). As an example, display elements emitting red, green, or blue light may be arranged two-dimensionally in the x direction and the y direction, and the display area DA configured to display images may be defined.

A non-display area NDA is a region in which sub-pixels are not arranged, and may include a first non-display area NDA1 and a second non-display area NDA2, wherein the first non-display area NDA1 surrounds (or is around) the transmissive area TA, and the second non-display area NDA2 surrounds (or is around) the display area DA. The first non-display area NDA1 may be arranged between the transmissive area TA and the display area DA, and the second non-display area NDA2 may be arranged outside of the display area DA.

Figure 2A:
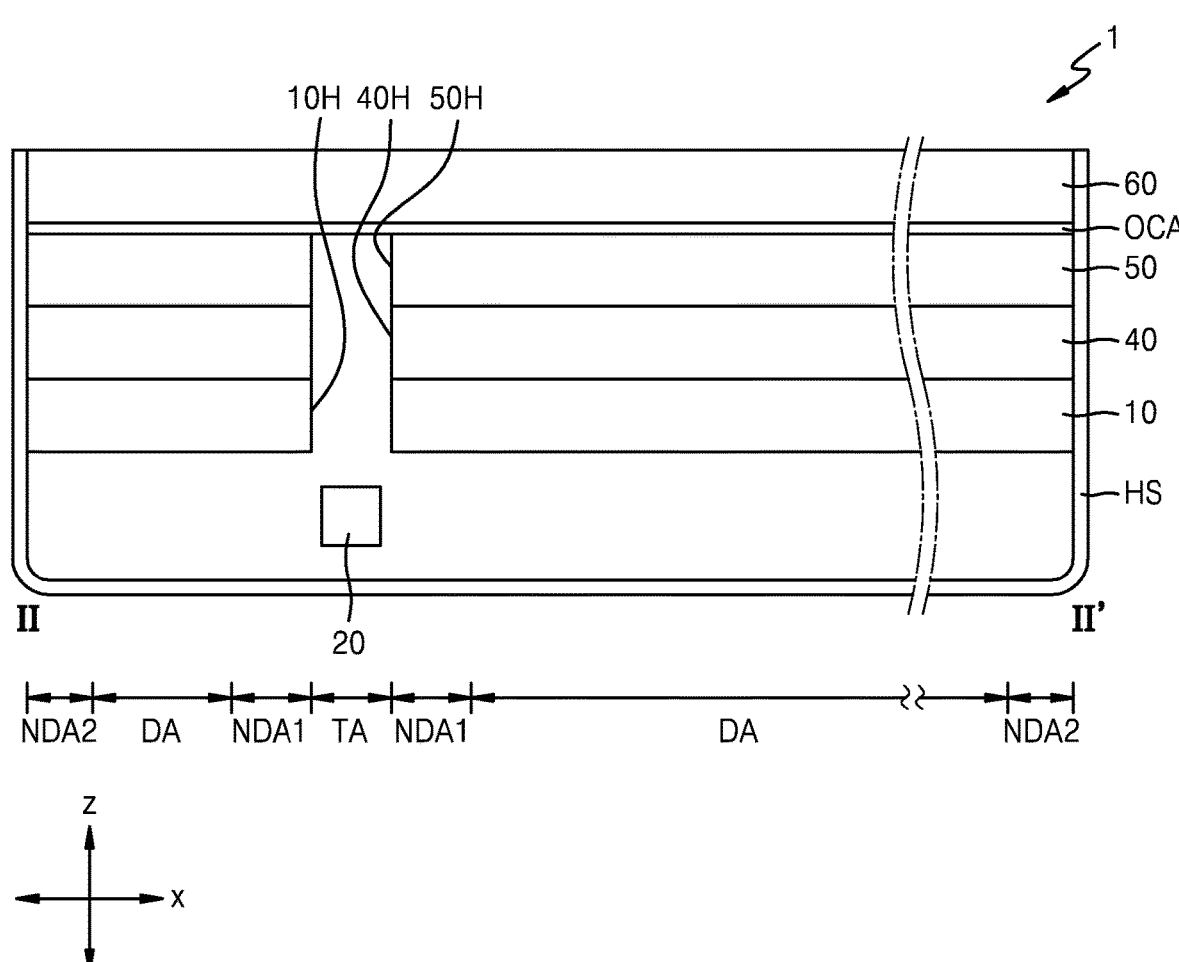
FIGS. 2A and 2B are cross-sectional views of the electronic apparatus according to one or more embodiments of the present disclosure, taken along the line II-II' of FIG. 1A.
Figure 2B:
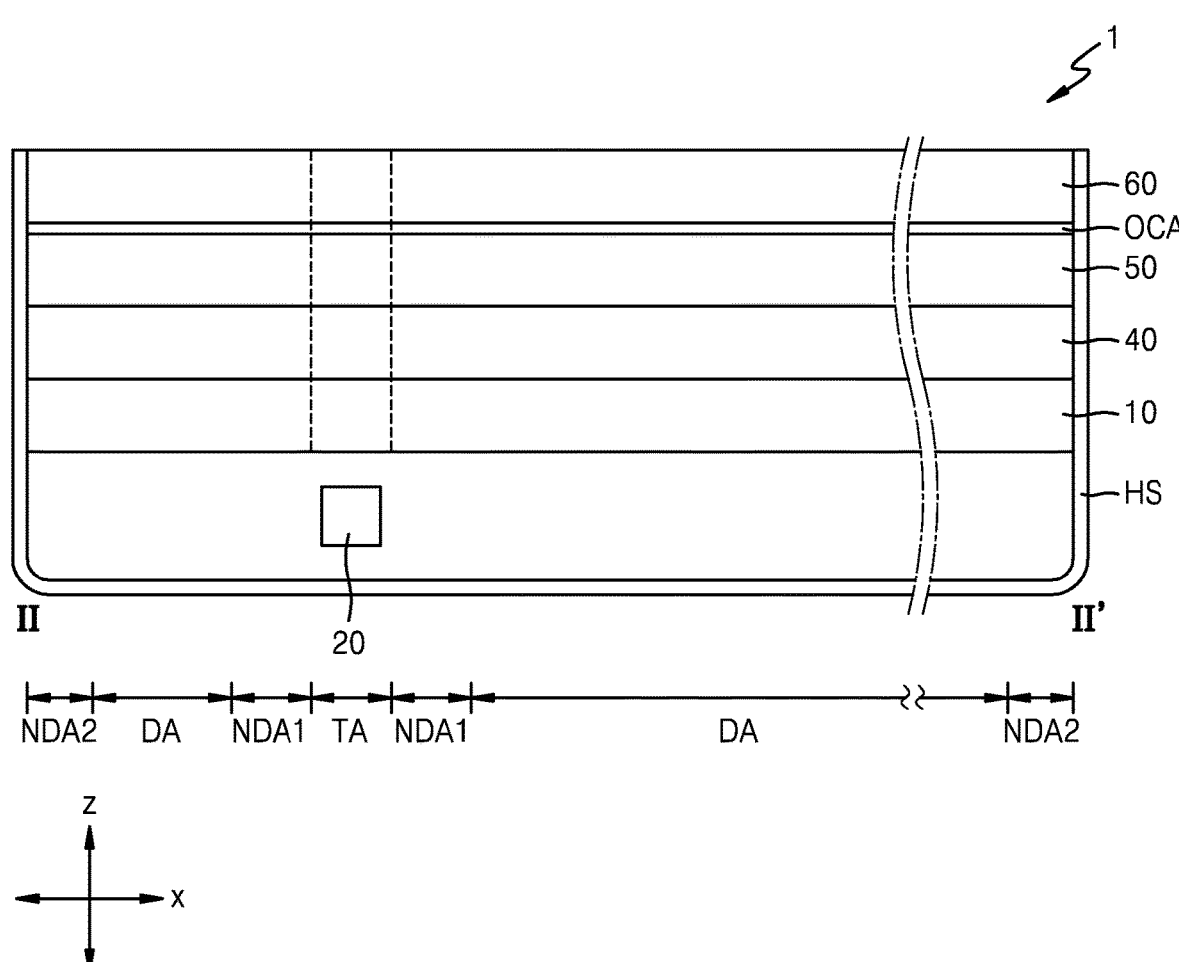

FIGS. 2A and 2B are cross-sectional views of the electronic apparatus 1 according to one or more embodiments of the present disclosure, taken along line II-II' of FIG. 1A. Though FIGS. 2A and 2B shows a cross-section of the electronic apparatus 1, taken along line II-II' of FIG. 1A, the cross-sectional structure of FIG. 1B also may have the same structure as that described with reference to FIGS. 2A and 2B.

Referring to FIGS. 2A and 2B, the electronic apparatus 1 may include a housing HS having one open side and a space in the inside thereof. The one open side of the housing HS may be coupled to a window 60.

A display panel 10, an input sensing layer 40, and an optical functional layer 50 may be disposed below the window 60. A component 20 may be disposed below the rear surface of the display panel 10.

The component 20 may be an electronic element that uses light or sound. The electronic element may be a sensor that measures a distance such as a proximity sensor, a sensor that recognizes a portion of a user's body (e.g., a fingerprint, an iris, a face and the like), a small lamp that outputs light, and/or a camera. The electronic element that uses light may use light in various wavelength bands such as visible light, infrared light, and/or ultraviolet light. The electronic element that uses sound may use ultrasonic waves and/or sound in different frequency bands.

The display panel 10 may be configured to display images. The display panel 10 may display images by using the display elements arranged in the display area DA. The display panel 10 may be a light-emitting display panel including a light-emitting diode. The light-emitting diode may include an organic light-emitting diode including an organic emission layer. In one or more embodiments, the light-emitting diode may be an inorganic light-emitting diode including an inorganic material. The inorganic light-emitting diode may include a PN-junction diode including inorganic semiconductor-based materials. When a forward voltage is applied to a PN-junction diode, holes and electrons are injected and energy created by recombination of the holes and the electrons is converted to light energy, and thus, light of a desired color (e.g., a preset color) may be emitted. The inorganic light-emitting diode may have a width in the range of several micrometers to hundreds of micrometers, or several nanometers to hundreds of nanometers. In one or more embodiments, the inorganic light-emitting diode may be denoted by a micro light-emitting diode. An emission layer of the light-emitting diode may include the organic material or inorganic material. In one or more embodiments, the emission layer of the light-emitting diode may include quantum dots. In other words, the light-emitting diode may be a quantum-dot light-emitting diode.

The display panel 10 may be a rigid display panel that has rigidity and thus is not easily bent, or a flexible display panel that has flexibility and thus is easily bendable, foldable, and/or rollable. In one or more embodiments, the display panel 10 may include a foldable display panel that is foldable and unfoldable, a curved display panel that has a curved display surface, a bent display panel in which a region except for a display surface is bent, a rollable display panel that is rollable and unrollable, and/or a stretchable display panel that is stretchable.

The input sensing layer 40 may obtain coordinate information corresponding to an external input, for example, a touch event. The input sensing layer 40 may include a sensing electrode (or a touch electrode) and trace lines connected to the sensing electrode. The input sensing layer 40 may be disposed (or at) on the display panel 10. The input sensing layer 40 may sense an external input by using a self-capacitance method and/or a mutual capacitance method.

The input sensing layer 40 may be directly formed on (or at) the display panel 10. As an example, the input sensing layer 40 may be successively formed after a process of forming the display panel 10. In one or more embodiments, an adhesive layer may not be disposed between the input sensing layer 40 and the display panel 10. Alternatively, the input sensing layer 40 may be formed separately, and then, coupled by using an adhesive layer. The adhesive layer may include an optically clear adhesive.

The optical functional layer 50 may include an anti-reflection layer. The anti-reflection layer may reduce the reflectivity of light (e.g., external light) incident on the display panel 10 from the outside through the window 60. The anti-reflection layer may include a retarder and/or a polarizer.

In one or more embodiments, the anti-reflection layer may include a black matrix and color filters. The color filters may be arranged by taking into account colors of light emitted respectively from the sub-pixels of the display panel 10. In one or more embodiments, the anti-reflection layer may include a destructive interference structure. The destructive interference structure may include a first reflection layer and a second reflection layer respectively disposed on (or at) different layers. First-reflected light and second-reflected light reflected by the first reflection layer and the second reflection layer, respectively, may destructively interfere with each other and thus the reflectivity of external light may be reduced.

The optical functional layer 50 may include a lens layer. The lens layer may improve a light output efficiency of light emitted from the display panel 10 and/or it may reduce color deviation. The lens layer may include a layer having a lens shape that is concave or convex, and/or a plurality of layers having different refractive indexes. The optical functional layer 50 may include both the anti-reflection layer and the lens layer described above, or one of the anti-reflection layer and the lens layer.

The optical functional layer 50 may be coupled to the window 60 through an adhesive layer such as an adhesive layer including an optical clear adhesive (OCA).

In one or more embodiments, each of the display panel 10, the input sensing layer 40, and/or the optical functional layer 50 may include a through hole located in the transmissive area TA. With regard to this, it is shown in FIG. 2A that the display panel 10, the input sensing layer 40, and the optical functional layer 50 include first to third through holes 10H, 40H, and 50H, respectively. The first through hole 10H may pass through the display panel 10 from the upper surface to the lower surface of the display panel 10, the second through hole 40H may pass through the input sensing layer 40 from the upper surface to the lower surface of the input sensing layer 40, and the third through hole 50H may pass through the optical functional layer 50 from the upper surface to the lower surface of the optical functional layer 50.

In one or more embodiments, at least one of the display panel 10, the input sensing layer 40, or the optical functional layer 50 may not include a through hole. As an example, one or more selected from the display panel 10, the input sensing layer 40, and the optical functional layer 50 may not include a through hole. In one or more embodiments, when a transmittance of the transmissive area TA may be secured, as shown in FIG. 2B, each of the display panel 10, the input sensing layer 40, and the optical functional layer 50 may not include a through hole located in the transmissive area TA. In one or more embodiments, the first non-display area NDA1 near the transmissive area TA may be omitted. In other words, the transmissive area TA may be surrounded by (or may have around it) the display area DA, and there may not be the first non-display area NDA1 between the transmissive area TA and the display area DA.

Figure 3:
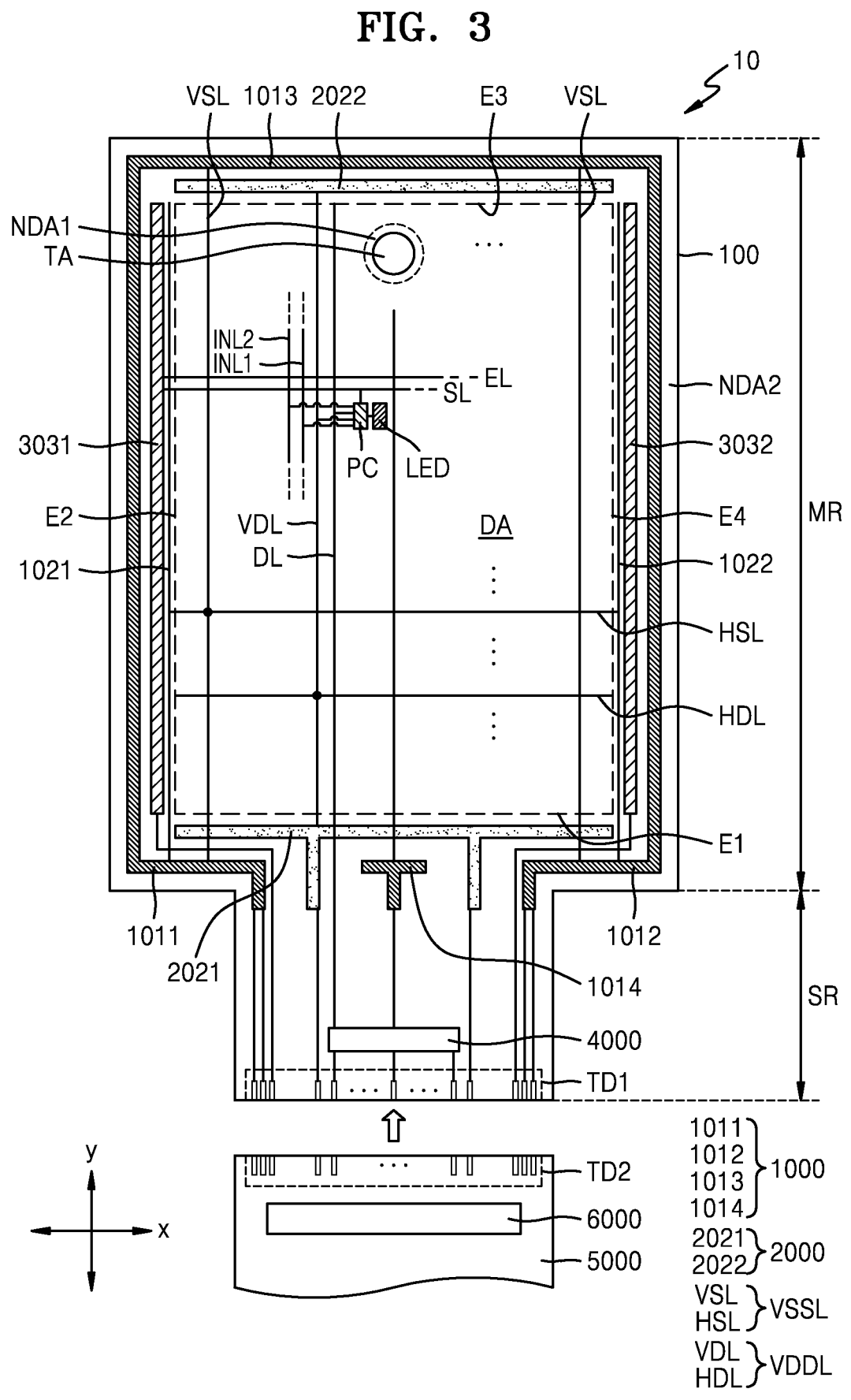
Figure 4:
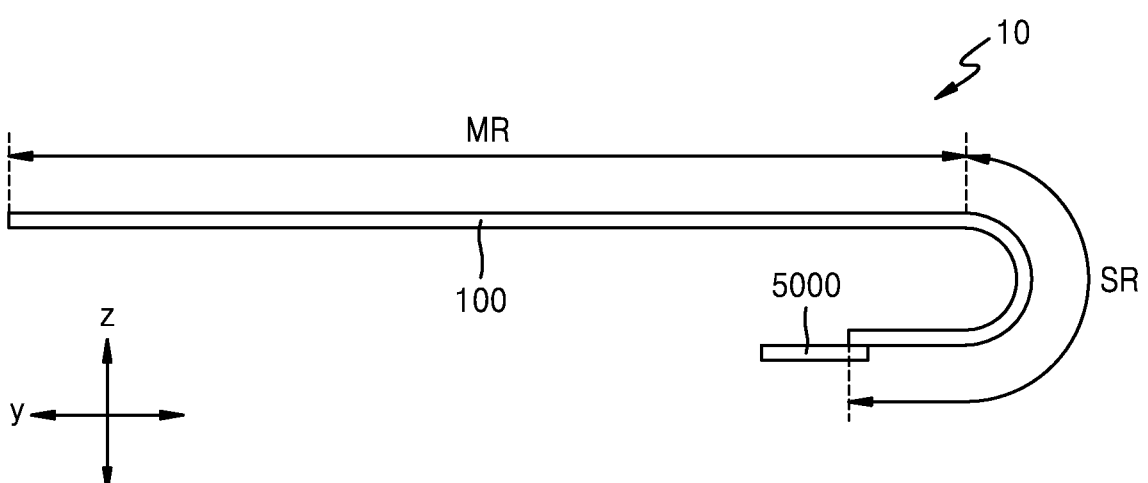
FIG. 4 is a schematic side view of the display panel of FIG. 3.

FIG. 3 is a schematic plan view of the display panel 10 according to one or more embodiments of the present disclosure, and FIG. 4 is a schematic side view of the display panel 10 of FIG. 3.

Referring to FIG. 3, the display panel 10 may include the transmissive area TA, the display area DA, the first non-display area NDA1, and the second non-display area NDA2. The shape of the display panel 10 may be the same as that of the substrate 100.

The transmissive area TA may be arranged inside the display area DA and surrounded entirely by (or may have around it) the display area DA in a plan view. The transmissive area TA may be arranged on (or at) the upper center of the display area DA as shown in FIG. 3. In one or more embodiments, the transmissive area TA may be arranged on (or at) the upper left side of the display area DA, or the upper right side of the display area DA. However, the present disclosure is not limited thereto, and the transmissive area TA may be arranged at various positions.

The first non-display area NDA1 may be located between the transmissive area TA and the display area DA, and may surround entirely (or may be around the transmissive area TA. As described with reference to FIG. 2A, in one or more embodiments the display panel 10 may include the first through hole 10H (see, e.g., FIG. 2A) located in the transmissive area TA, through which moisture may be introduced. Therefore, a structure for preventing (or substantially preventing) moisture from progressing into the display area DA may be disposed on (or at) the first through hole 10H. As an example, a layer (e.g., first and second functional layers of FIG. 7) including an organic material may be continuously formed in the display area DA to cover the display area DA entirely, but discontinuously formed in the first non-display area NDA1. As an example, a layer (e.g., the first and second functional layers of FIG. 7) including an organic material may include a plurality of portions arranged in the first non-display area NDA1 and separated from each other.

Though some layers of the display panel 10 (e.g., a second electrode (e.g., a cathode)) may be continuously formed in the display area DA to cover the display area DA entirely, a portion of the layer corresponding to the transmissive area TA may be removed to increase the transmittance of the transmissive area TA. In one or more embodiments, where the display panel 10 does not include the first through hole 10H as described with reference to FIG. 2B, one (e.g., the second electrode (e.g., the cathode) described below) of the plurality of layers included in the display panel 10 may include an opening (or a through hole) located in the transmissive area TA, and thus, the transmittance of the transmissive area TA may be improved.

The display area DA is a region configured to display images, and may include various shapes, for example, circular shapes, elliptical shapes, polygons, specific figures, and the one or more other suitable shapes. Though it is shown in FIG. 1 that the display area DA has an approximately quadrangular shape, the display area DA may have an approximately quadrangular shape having round edges in one or more embodiments.

Light-emitting diodes LED may be arranged in the display area DA. The light-emitting diodes LED may be electrically connected to respective sub-pixel circuits PC arranged in the display area DA. The sub-pixel circuits PC may each include transistors connected to a signal line or a voltage line for controlling turning-on/off, brightness, and the like of the light-emitting diode LED. With regard to this, FIG. 3 shows scan lines SL, emission control lines EL, and data lines DL as signal lines electrically connected to the transistors, and shows driving voltage lines VDDL, common voltage lines VSSL, first initialization voltage lines INL1, and second initialization voltage lines INL2 as voltage lines.

The second non-display area NDA2 may be arranged outside the display area DA. The second non-display area NDA2 may entirely surround (or be around) the display area DA in a plan view. A portion (referred to as a protrusion peripheral area, hereinafter) of the second non-display area NDA2 may extend in a direction away from the display area DA. In other words, the display panel 10 may include a main region MR and a subregion SR extending in one direction from the main region MR, wherein the main region MR includes the transmissive area TA, the first non-display area NDA1, the display area DA, and a portion of the second non-display area NDA2 surrounding the display area DA.

The subregion SR may correspond to the protrusion peripheral area. The width (the width in the x direction) of the subregion SR may be less than the width (the width in the x direction) of the main region MR. A portion of the subregion SR may be bent as shown in FIG. 4. In embodiments in which the display panel 10 is bent as shown in FIG. 4, the second non-display area NDA2, which is the non-display area, may not be viewed, or the area that is viewed may be reduced even though the second non-display area NDA2 is viewed when the electronic apparatus 1 (see, e.g., FIG. 1A) including the display panel 10 is viewed.

The shape of the display panel 10 may be substantially the same as that of the substrate 100. As an example, the substrate 100 may include the transmissive area TA, the first non-display area NDA1, the display area DA, and the second non-display area NDA2. In one or more embodiments, the substrate 100 may include the main region MR and the sub region SR.

As shown in FIG. 3, a common voltage supply line 1000, a driving voltage supply line 2000, first and second driving circuits 3031 and 3032, and a data driving circuit 4000 may be arranged in the second non-display area NDA2.

The common voltage supply line 1000 may include a first common voltage input part 1011, a second common voltage input part 1012, and a third common voltage input part 1014 adjacent to a first edge E1 of the display area DA. In one or more embodiments, the first and second common voltage input parts 1011 and 1012 may be adjacent to the first edge E1 of the display area DA, and may be apart (or separated) from each other. The third common voltage input part 1014 may be adjacent to the first edge E1 of the display area DA, and be located between the first and second common voltage input parts 1011 and 1012.

The first common voltage input part 1011 may be connected to the second common voltage input part 1012 by a body part 1013 extending along a second edge E2, a third edge E3, and a fourth edge E4 of the display area DA. In other words, the first common voltage input part 1011, the second common voltage input part 1012, and the body part 1013 may be formed as one body (e.g., an integrated body). In one or more embodiments, the common voltage supply line 1000 has a loop shape including an open side, and two opposite sides of the common voltage supply line 1000 may respectively correspond to the first common voltage input part 1011 and the second common voltage input part 1012, and a portion between the first common voltage input part 1011 and the second common voltage input part 1012 may correspond to the body part 1013.

A first auxiliary common voltage supply line 1021 and a second auxiliary common voltage supply line 1022 may be arranged in the second non-display area NDA2. Each of the first auxiliary common voltage supply line 1021 and the second auxiliary common voltage supply line 1022 may be a kind of branch extending from the common voltage supply line 1000.

The first auxiliary common voltage supply line 1021 may be electrically connected to the common voltage supply line 1000 and may extend along the second edge E2 of the display area DA. The first auxiliary common voltage supply line 1021 may be located between a first driving circuit 3031 and the second edge E2 of the display area DA.

The second auxiliary common voltage supply line 1022 may be electrically connected to the common voltage supply line 1000 and may extend along the fourth edge E4 of the display area DA. The second auxiliary common voltage supply line 1022 may be arranged between a second driving circuit 3032 and the fourth edge E4 of the display area DA.

The common voltage supply line 1000, the first auxiliary common voltage supply line 1021, and the second auxiliary common voltage supply line 1022 may be electrically connected to common voltage lines VSSL passing across the display area DA. The common voltage lines VSSL arranged in the display area DA may extend to cross each other. As an example, the common voltage lines VSSL may include common voltage lines extending in the y direction and common voltage lines extending in the x direction. Hereinafter, for convenience of description, the 'common voltage lines extending in the y direction' are referred to as vertical common voltage lines VSL, and the 'common voltage lines extending in the x direction' are referred to as a horizontal common voltage lines HSL.

The vertical common voltage lines VSL and the horizontal common voltage lines HSL may pass across the display area DA to cross each other. The vertical common voltage lines VSL and the horizontal common voltage lines HSL may be disposed on (or at) different layers.

The vertical common voltage lines VSL may be electrically connected to the common voltage supply line 1000. One end of each of the vertical common voltage lines VSL may be connected to the body part 1013, and another end of each of the vertical common voltage lines VSL may be connected to the first common voltage input part 1011, the second common voltage input part 1012, or the third common voltage input part 1013.

The horizontal common voltage lines HSL may be electrically connected to the first auxiliary common voltage supply line 1021 and the second auxiliary common voltage supply line 1022. One end of each of the horizontal common voltage lines HSL may be connected to the first auxiliary common voltage supply line 1021, and another end of each of the horizontal common voltage lines HSL may be connected to the second auxiliary common voltage supply line 1022. The horizontal common voltage lines HSL respectively arranged on (or at) the left and right sides of the transmissive area TA among the horizontal common voltage lines HSL are described further with reference to FIG. 15.

In one or more embodiments, each of the vertical common voltage lines VSL may be electrically connected to a respective one of the horizontal common voltage lines HSL through a contact hole through at least one insulating layer therebetween. A contact hole for connection between a vertical common voltage line VSL and its respective horizontal common voltage line HSL may be located in the display area DA. In one or more embodiments, a contact hole for connection of the vertical common voltage line VSL and its respective horizontal common voltage line HSL may be arranged in a portion of the display area DA located between the first edge E1 of the display area DA and the transmissive area TA. In other embodiments, the vertical common voltage line VSL may not contact the its respective horizontal common voltage line HSL in the display area DA.

The driving voltage supply line 2000 may include first and second driving voltage input parts 2021 and 2022 apart (or separated) from each other with the display area DA therebetween. The first and second driving voltage input parts 2021 and 2022 may extend substantially in parallel to each other with the display area DA therebetween. The first driving voltage input part 2021 may be adjacent to the first edge E1 of the display area DA, and the second driving voltage input part 2022 may be adjacent to the third edge E3 of the display area DA.

The driving voltage supply line 2000 may be electrically connected to the driving voltage lines VDDL passing across the display area DA. The driving voltage lines VDDL arranged in the display area DA may extend to cross each other. As an example, the driving voltage lines VDDL may include driving voltage lines extending in the y direction and driving voltage lines extending in the x direction. Hereinafter, for convenience of description, the 'driving voltage lines extending in the y direction' are referred to as vertical driving voltage lines VDL, and the 'driving voltage lines extending in the x direction' are referred to as horizontal driving voltage lines HDL.

The vertical driving voltage lines VDL and the horizontal driving voltage lines HDL may pass across the display area DA to cross each other. The vertical driving voltage lines VDL and the horizontal driving voltage lines HDL may be disposed on (or at) different layers, and connected to each other through contact holes formed in at least one insulating layer disposed therebetween. A contact hole for connection between each of the vertical driving voltage lines VDL and a respective one of the horizontal driving voltage lines HDL may be located in the display area DA.

The first and second driving circuits 3031 and 3032 may be arranged in the second non-display area NDA2, and electrically connected to the scan lines SL and the emission control lines EL. In one or more embodiments, some (e.g., the scan lines on the left of the transmissive area TA) of the scan lines SL may be electrically connected to the first driving circuit 3031, and the rest (e.g., the scan lines on the right of the transmissive area TA) of the scan lines SL may be connected to the second driving circuit 3032. The first and second driving circuits 3031 and 3032 may include a scan driver configured to generate scan signals. The generated scan signals may be transferred to one of the transistors of a respective sub-pixel circuit PC through a respective scan line SL. The first and second driving circuits 3031 and 3032 may include an emission control driver configured to generate emission control signals. The generated emission control signals may be transferred to one of the transistors of a respective sub-pixel circuit PC through a respective emission control line EL.

The data driver 4000 may be configured to transfer a data signal to one of the transistors of a respective sub-pixel circuit PC through a respective data line DL passing across the display area DA.

A first terminal part TD1 may be located on one side of the substrate 100 in a plan view. A printed circuit board 5000 may be attached to the first terminal part TD1. The printed circuit board 5000 may include a second terminal part TD2 electrically connected to the first terminal part TD1. A controller 6000 may be disposed on (or at) the printed circuit board 5000. Control signals of the controller 6000 may be provided to each of the first and second driving circuits 3031 and 3032, the data driving circuit 4000, the driving voltage supply line 2000, and the common voltage supply line 1000 through the first and second terminal parts TD1 and TD2.

Figure 5:
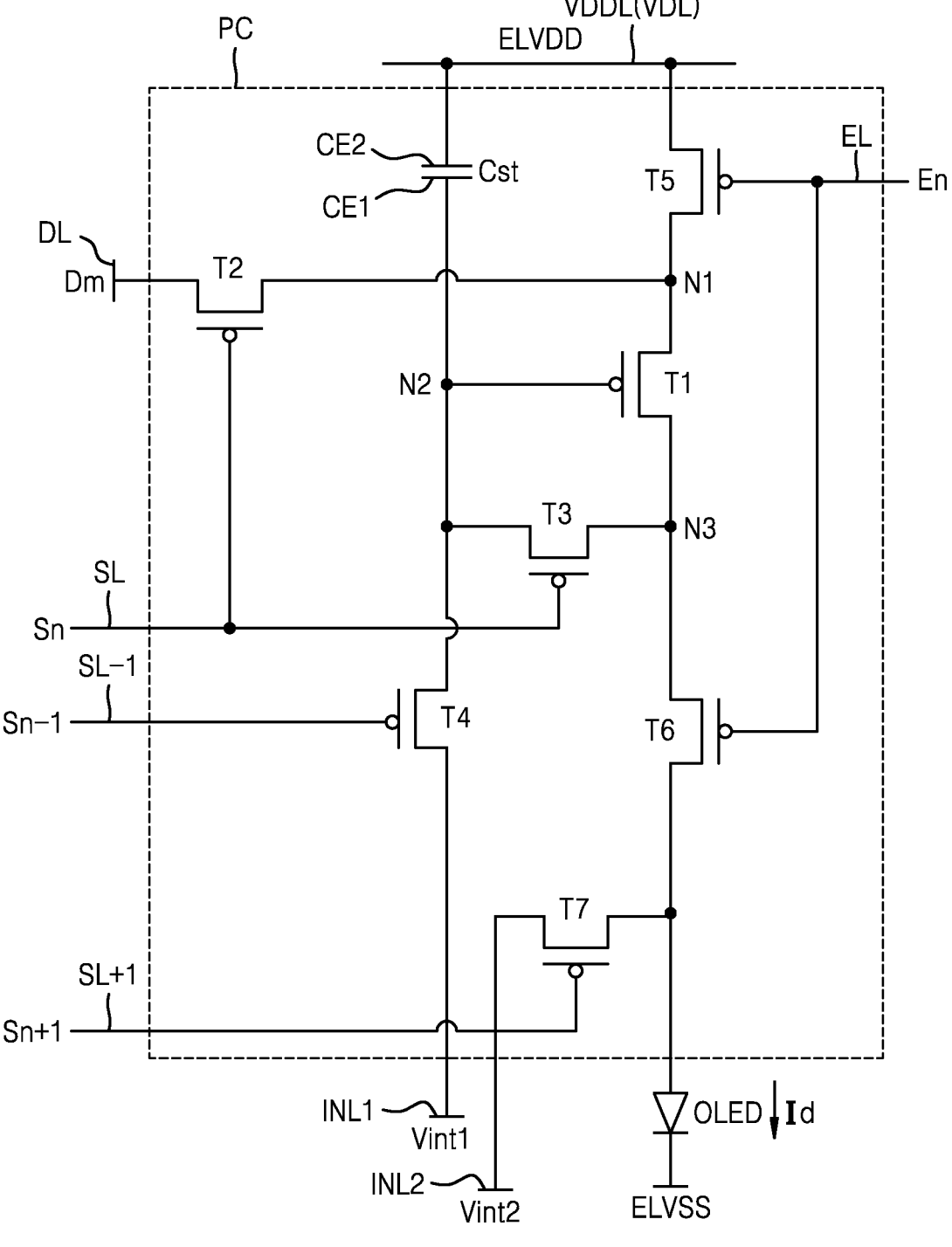
FIG. 5 is a schematic equivalent circuit diagram of a sub-pixel circuit electrically connected to a light-emitting diode disposed on (or at) a display panel according to one or more embodiments of the present disclosure.

FIG. 5 is a schematic equivalent circuit diagram of a sub-pixel circuit electrically connected to a light-emitting diode disposed on (or at) a display panel according to one or more embodiments of the present disclosure.

FIG. 5, and other figures herein, illustrate and are described with respect to a single sub-pixel PC of the plurality of sub-pixels PC. This sub-pixel PC is described individually, as are its respective scan lines SL, driving voltage lines VDL, initialization voltage lines, emission control line EL, data line DL, etc., that are connected to this respective sub-pixel PC. However, this features and connections of this sub-pixel PC may be applicable to other sub-pixels PC through the display area DA and their respective components and connections.

As shown in FIG. 5, the sub-pixel circuit PC may include a plurality of thin-film transistors T1, T2, T3, T4, T5, T6, and T7, and a storage capacitor Cst. The sub-pixel circuit PC is electrically connected to the light-emitting diode. Hereinafter, for convenience of description, one or more embodiments in which the light-emitting diode is an organic light-emitting diode OLED is described.

The plurality of thin-film transistors T1, T2, T3, T4, T5, T6, and T7 may include a driving transistor T1, a switching transistor T2, a compensation transistor T3, a first initialization transistor T4, an operation control transistor T5, an emission control transistor T6, and a second initialization transistor T7.

The light-emitting diode, for example, the organic light-emitting diode OLED may include a first electrode (e.g., an anode) and a second electrode (e.g., a cathode). The first electrode of the organic light-emitting diode OLED may be connected to the driving transistor T1 through the emission control transistor T6 to receive a driving current Id, and the second electrode may receive a common voltage ELVSS. The organic light-emitting diode OLED may generate light of brightness corresponding to a driving current Id.

The plurality of thin-film transistors T1, T2, T3, T4, T5, T6, and T7 may be p-channel metal oxide semiconductor field-effect transistors (MOSFETs). In one or more embodiments, some of the plurality of thin-film transistors T1, T2, T3, T4, T5, T6, and T7 may be n-channel metal oxide semiconductor (NMOS) field-effect transistors (n-channel MOSFETs), and the rest may be p-channel metal oxide semiconductor (PMOS) field-effect transistors (p-channel MOSFETs). As an example, among the plurality of thin-film transistors T1, T2, T3, T4, T5, T6, and T7, the compensation transistor T3 and the first initialization transistor T4 may be n-channel MOSFETs (NMOS), and the rest may be p-channel MOSFETs (PMOS). In one or more embodiments, the compensation thin-film transistor T3 of the plurality of thin-film transistors T1, T2, T3, T4, T5, T6, and T7 may be an NMOS, and the rest may be PMOSs. In other embodiments, all of the plurality of thin-film transistors T1, T2, T3, T4, T5, T6, and T7 may be NMOSs. The plurality of thin-film transistors T1, T2, T3, T4, T5, T6, and T7 may each include amorphous silicon and/or polycrystalline silicon. When needed, a thin-film transistor, which is an NMOS, may include an oxide semiconductor.

The sub-pixel circuit PC may be electrically connected to scan lines SL, including a previous scan line SL−1, and a next scan line SL+1, wherein a scan line SL is configured to transfer a scan signal Sn, the previous scan line SL−1 is configured to transfer a previous scan signal Sn−1 to the first initialization transistor T4, and the next scan line SL+1 is configured to transfer a next scan signal Sn+1 to the second initialization transistor T7.

The sub-pixel circuit PC may be electrically connected to the emission control line EL and the data line DL, wherein the emission control line EL is configured to transfer an emission control signal En to the operation control transistor T5 and the emission control transistor T6, and the data line DL is configured to transfer a data signal Dm.

The driving voltage line VDDL, for example, a vertical driving voltage line VDL may be configured to transfer a driving voltage ELVDD to the driving transistor T1, a first initialization voltage line INL1 may be configured to transfer a first initialization voltage Vint1 that initializes the driving transistor T1, and a second initialization voltage line INL2 may be configured to transfer a second initialization voltage Vint2 that initializes the first electrode of the organic light-emitting diode OLED.

A driving gate electrode of the driving transistor T1 may be connected to the storage capacitor Cst through a second node N2, one of a source electrode (or a source region) or a drain electrode (or a drain region) of the driving transistor T1 may be connected to the vertical driving voltage line VDDL through the operation control transistor T5, and the other of the source electrode (or the source region) or the drain electrode (or the drain region) of the driving transistor T1 may be electrically connected to a first electrode (e.g., an anode) of the organic light-emitting diode OLED through the emission control transistor T6. The driving transistor T1 may be configured to receive a data signal Dm and supply the driving current to the organic light-emitting diode OLED according to a switching operation of the switching transistor T2. That is, the driving transistor T1 may be configured to control the amount of current flowing from the first node N1 to the organic light-emitting diode OLED in response to a voltage applied to the second node N2 and changed by a data signal Dm, the first node N1 being electrically connected to the vertical driving voltage line VDDL.

A switching gate electrode of the switching transistor T2 may be connected to the scan line SL configured to transfer a scan signal Sn, one of a source electrode (or a source region) or a drain electrode (or a drain region) of the switching transistor T2 may be connected to the data line DL, and the other of the source electrode (or the source region) or the drain electrode (or the drain region) of the switching transistor T2 may be connected to the driving transistor T1 through the first node N1 and connected to the vertical driving voltage line VDDL through the operation control transistor T5. The switching transistor T2 may be configured to transfer a data signal Dm from the data line DL to the first node N1 in response to a voltage applied to the scan line SL. That is, the switching transistor T2 may be turned on according to a first scan signal Sn transferred through the first scan line SL1, and may perform a switching operation of transferring a data signal Dm to the driving transistor T1 through the first node N1, the data signal Dm being transferred through the data line DL.

A compensation gate electrode of the compensation transistor T3 is connected to the scan line SL. One of a source electrode (or a source region) or a drain electrode (or a drain region) of the compensation transistor T3 may be connected to the first electrode of the organic light-emitting diode OLED by way of the emission control transistor T6 through a third node N3. The other of the source electrode (or the source region) or the drain electrode (or the drain region) of the compensation transistor T3 may be connected to a first capacitor electrode CE1 of the storage capacitor Cst and the driving gate electrode of the driving transistor T1 through the second node N2. The compensation transistor T3 may diode-connect the driving transistor T1 by being turned on according to a second scan signal Sn' received through the scan line SL.

A first initialization gate electrode of the first initialization transistor T4 may be connected to the previous scan line SL−1. One of a source electrode (or a source region) or a drain electrode (or a drain region) of the first initialization transistor T4 may be connected to the first initialization voltage line INL1. The other of the source electrode (or the source region) or the drain electrode (or the drain region) of the first initialization transistor T4 may be connected to the first capacitor electrode CE1 of the storage capacitor Cst and the driving gate electrode of the driving transistor T1 through the second node N2. The first initialization transistor T4 may be configured to apply the first initialization voltage Vint1 from the first initialization voltage line INL1 to the second node N2 according to a voltage applied to the previous scan line SL−1. That is, the first initialization transistor T4 may be turned on according to a previous scan signal Sn−1 received through the previous scan line SL−1 and may perform an initialization operation of initializing the voltage of the driving gate voltage of the driving transistor T1 by transferring the first initialization voltage Vint1 to the driving gate electrode of the driving transistor T1.

An operation control gate electrode of the operation control transistor T5 may be connected to the emission control line EL, one of a source electrode (or a source region) or a drain electrode (or a drain region) of the operation control transistor T5 may be connected to the vertical driving voltage line VDDL, and the other may be connected to the driving transistor T1 and the switching transistor T2 through the first node N1.

An emission control gate electrode of the emission control transistor T6 may be connected to the emission control line EL, one of a source electrode (or a source region) or a drain electrode (or a drain region) of the emission control transistor T6 may be connected to the driving transistor T1 and the compensation transistor T3 through the third node N3, and the other of the source electrode (or the source region) or the drain electrode (or the drain region) of the emission control transistor T6 may be electrically connected to the first electrode (e.g., the anode) of the organic light-emitting diode OLED.

The operation control transistor T5 and the emission control transistor T6 may be simultaneously turned on according to an emission control signal En transferred through the emission control line EL, the driving voltage ELVDD is transferred to the organic light-emitting diode OLED, and the driving current flows through the organic light-emitting diode OLED.

A second initialization gate electrode of the second initialization transistor T7 may be connected to the next scan line SL+1, one of a source electrode (or a source region) or a drain electrode (or a drain region) of the second initialization transistor T7 may be connected to the first electrode (e.g., the anode) of the organic light-emitting diode OLED, and the other of the source electrode (or the source region) or the drain electrode (or the drain region) of the second initialization transistor T7 may be electrically connected to the second initialization voltage line INL2 to receive the second initialization voltage Vint2. The second initialization transistor T7 is turned on according to a next scan signal Sn+1 transferred through the next scan line SL+1 and initializes the first electrode (e.g., the anode) of the organic light-emitting diode OLED.

Though it is shown in FIG. 5 that the fourth transistor T4 and the seventh transistor T7 are respectively connected to the previous scan line SL−1 and the next scan line SL+1, the embodiments of the present disclosure are not limited thereto. In one or more embodiments, both the first initialization transistor T4 and the second initialization transistor T7 may be connected to the previous scan line SL−1 and thus driven according to a previous scan signal Sn−1.

The storage capacitor Cst may include the first capacitor electrode CE1 and a second capacitor electrode CE2. The first capacitor electrode CE1 of the storage capacitor Cst is connected to the driving gate electrode of the driving transistor T1 through the second node N2, and the second capacitor electrode CE2 of the storage capacitor Cst is connected to the vertical driving voltage line VDL. The storage capacitor Cst may be configured to store charge corresponding to a difference between a voltage of the driving gate of the driving transistor T1 and the driving voltage ELVDD.

Figure 6:
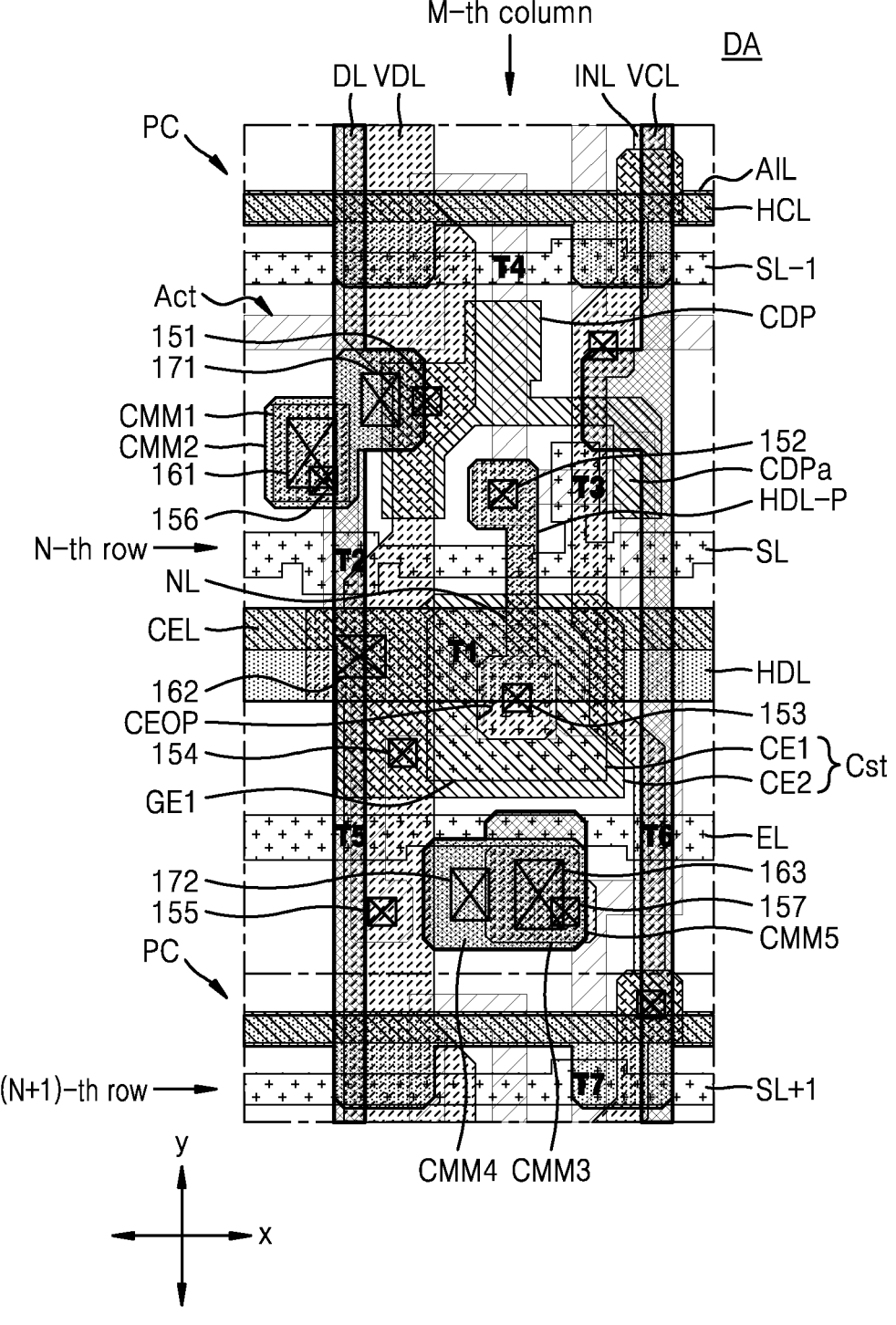
FIG. 6 is a layout view of a sub-pixel circuit on an N-th row, and a sub-pixel circuit on an (N+1)-th row arranged in a display area of a display panel according to one or more embodiments of the present disclosure.

FIG. 6 is a layout view of a sub-pixel circuit on an N-th row, and a sub-pixel circuit on an (N+1)-th row arranged in a display area of a display panel according to one or more embodiments of the present disclosure. For convenience of description, FIG. 6 shows a portion of a sub-pixel circuit PC on an N-th row and a pixel circuit PC on a (N+1)-th row arranged on (or at) an M-th column. The sub-pixel circuits PC shown in FIG. 6 may correspond to the sub-pixel circuits PC arranged around the transmissive area TA (see, e.g., FIG. 3). A sub-pixel circuit arranged relatively away from the transmissive area TA (see, e.g., FIG. 3), for example, the sub-pixel circuit arranged between the first edge E1 (see, e.g., FIG. 3) of the display area DA and the transmissive area TA may also have a structure similar to that of the sub-pixel circuit PC shown in FIG. 6.

Referring to FIG. 6, the driving transistor T1, the switching transistor T2, the compensation transistor T3, the first initialization transistor T4, the operation control transistor T5, the emission control transistor T6, and the second initialization transistor T7 may be formed along a semiconductor layer Act.

The semiconductor layer Act includes a plurality of bent portions. The driving transistor T1, the switching transistor T2, the compensation transistor T3, the first initialization transistor T4, the operation control transistor T5, the emission control transistor T6, and the second initialization transistor T7 may be formed along the bent portions of the semiconductor layer Act. In other words, a semiconductor of the driving transistor T1, a semiconductor of the switching transistor T2, a semiconductor of the compensation transistor T3, a semiconductor of the first initialization transistor T4, a semiconductor of the operation control transistor T5, a semiconductor of the emission control transistor T6, and a semiconductor of the second initialization transistor T7 may respectively correspond to portions of the semiconductor layer Act shown in FIG. 6. The semiconductor of the driving transistor T1, the semiconductor of the switching transistor T2, the semiconductor of the compensation transistor T3, the semiconductor of the first initialization transistor T4, the semiconductor of the operation control transistor T5, the semiconductor of the emission control transistor T6, and the semiconductor of the second initialization transistor T7 may be connected to each other to constitute the semiconductor layer Act shown in FIG. 6.

The driving transistor T1 may include a portion (referred to as a first portion of the semiconductor layer Act, or a driving semiconductor, hereinafter) of the semiconductor layer Act, and a driving gate electrode GE1 on the driving semiconductor. The driving semiconductor of the driving transistor T1 may include a channel region, a source region, and a drain region, wherein the channel region overlaps the driving gate electrode GE1, and the source region and the drain region are respectively arranged on (or at) two opposite sides of the channel region. The source region and the drain region of the driving semiconductor may respectively correspond to the source electrode and the drain electrode. The channel region of the driving semiconductor may have a bent shape below the gate electrode GE1.

The switching transistor T2 may include a portion (referred to as a second portion of the semiconductor layer Act, or a switching semiconductor, hereinafter) of the semiconductor layer Act, and a switching gate electrode on the switching semiconductor. The switching gate electrode is a portion of the scan line SL extending in a first direction (e.g., an x direction). A portion of the scan line SL that overlaps the second portion (or the switching semiconductor) of the semiconductor layer Act may correspond to the switching gate electrode. The switching semiconductor may include a channel region, a source region, and a drain region, wherein the channel region overlaps the scan line SL, and the source region and the drain region are respectively arranged on (or at) two opposite sides of the channel region. The source region and the drain region of the switching semiconductor may respectively correspond to the source electrode and the drain electrode.

The compensation transistor T3 may include a portion (referred to as a third portion of the semiconductor layer Act, or a compensation semiconductor, hereinafter) of the semiconductor layer Act, and a compensation gate electrode on the switching semiconductor. The compensation gate electrode is a portion of the scan line SL. A portion of the scan line SL that corresponds to the third portion (e.g., the compensation semiconductor) of the semiconductor layer Act may correspond to the compensation gate electrode. With regard to this, it is shown in FIG. 6 that a portion of the scan line SL extending in the first direction (e.g., the x direction) and a portion extending from the scan line SL in the y direction are compensation gate electrodes and overlap the third portion (or the compensation semiconductor) of the semiconductor layer Act. As shown in FIG. 6, the compensation transistor T3 may be a dual gate type transistor having two gate electrodes. The compensation semiconductor may include channel regions, a source region, and a drain region, wherein the channel regions overlap the scan line SL, and the source region and the drain region are respectively arranged on (or at) two opposite sides of the channel regions. The source region and the drain region of the compensation semiconductor may respectively correspond to the source electrode and the drain electrode.

The first initialization transistor T4 may include a portion (referred to as a fourth portion of the semiconductor layer Act, or a first initialization semiconductor, hereinafter) of the semiconductor layer Act, and a first initialization gate electrode on the first initialization semiconductor. The first initialization gate electrode may be a portion of the previous scan line SL−1 that overlaps the fourth portion (or the first initialization semiconductor) of the semiconductor layer Act. With regard to this, it is shown in FIG. 6 that the previous scan line SL−1 extending in the first direction (e.g., the x direction) overlaps two portions of the first initialization semiconductor.

As shown in FIG. 6, the first initialization semiconductor may have a C-shape with an open bottom in a plan view, and the previous scan line SL−1 overlaps two portions of the first initialization semiconductor. As shown in FIG. 6, the first initialization transistor T4 may be a dual gate type transistor having two gate electrodes. The first initialization semiconductor may include channel regions, a source region, and a drain region, wherein the channel regions overlap the scan line SL, and the source region and the drain region are respectively arranged on (or at) two opposite sides of the channel regions. The source region and the drain region of the first initialization semiconductor may respectively correspond to the source electrode and the drain electrode.

The operation control transistor T5 may include a portion (referred to as a fifth portion of the semiconductor layer Act, or an operation control semiconductor, hereinafter) of the semiconductor layer Act, and an operation control gate electrode on the operation control semiconductor. The operation control gate electrode is a portion of the emission control line EL extending in the first direction (e.g., the x direction). A portion of the emission control line EL that overlaps the fifth portion (or the operation control semiconductor) of the semiconductor layer Act may correspond to the operation control gate electrode. The operation control semiconductor may include a channel region, a source region, and a drain region, wherein the channel region overlaps the operation control line EL, and the source region and the drain region are respectively arranged on (or at) two opposite sides of the channel region. The source region and the drain region of the operation control semiconductor may respectively correspond to the source electrode and the drain electrode.

The emission control transistor T6 may include a portion (referred to as a sixth portion of the semiconductor layer Act, or an emission control semiconductor, hereinafter) of the semiconductor layer Act, and an emission control gate electrode on the emission control semiconductor. The emission control gate electrode is a portion of the emission control line EL. A portion of the emission control line EL that corresponds to the sixth portion (e.g., the emission control semiconductor) of the semiconductor layer Act may correspond to the emission control gate electrode. The emission control semiconductor may include a channel region, a source region, and a drain region, wherein the channel region overlaps the emission control line EL, and the source region and the drain region are respectively arranged on (or at) two opposite sides of the channel region. The source region and the drain region of the emission control semiconductor may respectively correspond to the source electrode and the drain electrode.

The second initialization transistor T7 may include a portion (referred to as a seventh portion of the semiconductor layer Act, or a second initialization semiconductor, hereinafter) of the semiconductor layer Act, and a second initialization gate electrode on the second initialization semiconductor. The second initialization control gate electrode is a portion of the next scan line SL+1 extending in the first direction (e.g., the x direction). A portion of the next scan line SL+1 that overlaps the seventh portion (or the seventh initialization semiconductor) of the semiconductor layer Act may correspond to the second initialization gate electrode. The second initialization semiconductor may include a channel region, a source region, and a drain region, wherein the channel region overlaps the next scan line SL+1, and the source region and the drain region are respectively arranged on (or at) two opposite sides of the channel regions. The source region and the drain region of the second initialization semiconductor may respectively correspond to the source electrode and the drain electrode.

The next scan line SL+1 may be configured to transfer the same signal as that of the scan line SL. As an example, the next scan line SL+1 on an (N+1)-th row may be configured to transfer the same electrical signal as that of the scan line SL on an N row to the second initialization transistor T7 with a time difference.

The driving transistor T1, the switching transistor T2, the compensation transistor T3, the first initialization transistor T4, the operation control transistor T5, the emission control transistor T6, and the storage capacitor Cst may be arranged on (or at) a region corresponding to the same pixel circuit PC. As an example, while the driving transistor T1, the switching transistor T2, the compensation transistor T3, the first initialization transistor T4, the operation control transistor T5, the emission control transistor T6, and the storage capacitor Cst may be arranged on (or at) a region corresponding to the same pixel circuit PC (e.g., the sub-pixel circuit on the N-th row and the M-th column), the second initialization transistor T7 may be arranged in a region corresponding to another sub-pixel circuit PC (e.g., a sub-pixel circuit on the (N+1)-th row and the N-th column).

The storage capacitor Cst may include the first capacitor electrode CE1 and a second capacitor electrode CE2 overlapping each other. The first capacitor electrode CE1 may include the driving gate electrode GE1. As an example, the first capacitor electrode CE1 and the driving gate electrode GE1 may substantially correspond to the same conductor. In other words, the first capacitor electrode CE1 may serve as the driving gate electrode GE1, and the driving gate electrode GE1 may serve as the first capacitor electrode CE1. The first capacitor electrode CE1 and/or the driving gate electrode GE1 may each have an isolated shape in a plan view.

The first capacitor electrode CE1, the driving gate electrode GE1, the scan line SL, the previous scan line SL−1, the next scan line SL+1, and the emission control line EL may be formed on (or at) the same layer. The first capacitor electrode CE1, the driving gate electrode GE1, the scan line SL, the previous scan line SL−1, the next scan line SL+1, and the emission control line EL may include the same material.

The second capacitor electrode CE2 may be a portion of an electrode voltage line CEL. The electrode voltage line CEL may extend in the first direction (e.g., the x direction). A portion of the electrode voltage line CEL may protrude in the second direction (e.g., they direction), and the portion may correspond to the second capacitor electrode CE2.

An auxiliary initialization voltage line AIL may extend in the first direction (e.g., the x direction). The auxiliary initialization voltage line AIL may be adjacent to the previous scan line SL−1. In one or more embodiments, the auxiliary initialization voltage line AIL may be arranged to pass across the first initialization semiconductor of the first initialization transistor T4. The auxiliary initialization voltage line AIL may have a suitable voltage (e.g., a preset voltage), for example, a voltage level of the first initialization voltage Vint1 or the second initialization voltage Vint2.

A conductive piece CDP may be arranged between the previous scan line SL−1 and the scan line SL. As an example, the conductive piece CDP may be arranged between the first initialization transistor T4 and the compensation transistor T3. The conductive piece CDP may have an isolated shape in a plan view. The conductive piece CDP may be electrically connected to the vertical driving voltage line VDL. As an example, the conductive piece CDP may be electrically connected to the vertical driving voltage line VDL through a contact hole 151 of an insulating layer disposed between the vertical driving voltage line VDL and the conductive piece CDP. A portion CDPa of the conductive piece CDP may overlap a portion of the compensation semiconductor of the compensation transistor T3. As an example, a portion CDPa of the conductive piece CDP may overlap a portion of the compensation semiconductor located between a portion of the scan line SL and a portion protruding from the scan line SL (or a portion of the compensation semiconductor located between two channel regions of the compensation semiconductor).

The second capacitor electrode CE2, the electrode voltage line CEL, the conductive piece CDP, and the auxiliary initialization voltage line AIL may be formed on (or at) the same layer. The second capacitor electrode CE2, the electrode voltage line CEL, the conductive piece CDP, and the auxiliary initialization voltage line AIL may include the same material.

The vertical driving voltage line VDL may extend in the second direction (e.g., the y direction). The vertical driving voltage line VDL may be disposed on (or at) the electrode voltage line CEL and may cross a portion of the electrode voltage line CEL. The vertical driving voltage line VDL may be connected to the electrode voltage line CEL through a contact hole 154. The vertical driving voltage line VDL may be connected to the driving control semiconductor of the operation control transistor T5 through a contact hole 155.

The initialization voltage line INL may extend in the second direction (e.g., the y direction). The initialization voltage line INL of FIG. 6 may be one of the first initialization voltage line INL1 or the second initialization voltage line INL2 described, e.g., with reference to FIGS. 3 and 5. As an example, the initialization voltage line INL on one of two adjacent columns may be one of the first initialization voltage line INL1 (see, e.g., FIGS. 3 and 5) and the second initialization voltage line INL2 (see, e.g., FIGS. 3 and 5), and the initialization voltage line INL on the other of the two adjacent columns may be the other of the first initialization voltage line INL1 (see, e.g., FIGS. 3 and 5) and the second initialization voltage line INL2 (see, e.g., FIGS. 3 and 5). The first initialization voltage line INL1 (see, e.g., FIGS. 3 and 5) and the second initialization voltage line INL2 (see, e.g., FIGS. 3 and 5) may be alternately arranged.

In one or more embodiments, the initialization voltage line INL on the M-th column may be the second initialization voltage line INL2 (see, e.g., FIGS. 3 and 5), and the initialization voltage line INL on the (M−1)-th column may be the first initialization voltage line INL1 (see, e.g., FIGS. 3 and 5). In one or more embodiments, a first initialization semiconductor of the first initialization transistor T4 arranged in the sub-pixel circuit PC on the M-th column may be connected as one body (e.g., an integrated body) with a first initialization semiconductor of the first initialization transistor T4 arranged in the sub-pixel circuit PC on the (M−1)-th column. The first initialization semiconductor arranged in the sub-pixel circuit PC on the M-th column, and the first initialization semiconductor arranged in the sub-pixel circuit PC on the (M−1)-th column, connected to each other as one body (e.g., an integrated body), may receive the first initialization voltage from the first initialization voltage line, which is the initialization voltage line arranged on (or at) the (M−1)-th column.

Similarly, a second initialization semiconductor of the second initialization transistor T7 arranged in the sub-pixel circuit PC on the M-th column may be connected as one body (e.g., an integrated body) with a second initialization semiconductor of the second initialization transistor T7 arranged in the sub-pixel circuit PC on the (M+1)-th column. The second initialization semiconductor arranged in the sub-pixel circuit PC on the M-th column, and the second initialization semiconductor arranged in the sub-pixel circuit PC on the (M+1)-th column, connected to each other as one body (e.g., an integrated body), may receive the second initialization voltage from the second initialization voltage line, which is the initialization voltage line INL (see, e.g., FIG. 6) arranged on (or at) the M-th column.

A node connection line NL may electrically connect the driving transistor T1 to the compensation transistor T3. A first end of the node connection line NL may be connected to one of the source region or the drain region of the compensation semiconductor layer of the compensation transistor T3 through a contact hole 152 through at least one insulating layer disposed between the node connection line NL and the compensation semiconductor layer. A second end of the node connection line NL may be connected to the driving gate electrode GE1 through the contact hole 153 through at least one insulating layer disposed between the node connection line NL and the driving gate electrode GE1. For the connection between the second end of the node connection line NL and the driving gate electrode GE1, the second capacitor electrode CE2 may include an opening CEOP that overlaps the driving gate electrode GE1.

The node connection line NL may extend in the second direction (e.g., the y direction). The node connection line NL, the vertical driving voltage line VDL, and the initialization voltage line INL may be disposed on (or at) the same layer. The node connection line NL, the vertical driving voltage line VDL, and the initialization voltage line INL may include the same material.

The horizontal driving voltage line HDL may extend in the first direction (e.g., the x direction). The horizontal driving voltage line HDL may overlap the electrode voltage line CEL. As an example, the horizontal driving voltage line HDL may overlap a portion of the electrode voltage line CEL and a portion of the second capacitor electrode CE2.

The horizontal driving voltage line HDL may be disposed on (or at) the vertical driving voltage line VDL and may cross a portion of the vertical driving voltage line VDL. The horizontal driving voltage line HDL may be connected to the vertical driving voltage line VDL through a contact hole 162. The vertical driving voltage line VDL may be connected to the electrode voltage line CEL through a contact hole 154. Accordingly, the horizontal driving voltage line HDL, the vertical driving voltage line VDL, a portion of the electrode voltage line CEL, and the second capacitor electrode CE2 may have the same voltage level (e.g., a common voltage level).

The horizontal driving voltage line HDL may include a protrusion portion HDL-P that protrudes from the horizontal driving voltage line HDL in the second direction (e.g., the y direction). The protrusion portion HDL-P may have a shape similar to that of the node connection line NL, and overlap the node connection line NL.

A conductive line HCL may extend in the first direction (e.g., the x direction). The conductive line HCL may be adjacent to the previous scan line SL−1. The conductive line HCL may be adjacent to the first initialization transistor T4. As an example, the conductive line HCL may cross the first initialization semiconductor of the first initialization transistor T4. The conductive line HCL may have a voltage level of a constant voltage. As an example, the conductive line HCL may have the same voltage level as the driving voltage ELVDD (see, e.g., FIG. 5).

The horizontal driving voltage line HDL and the conductive line HCL may be disposed on (or at) the same layer. The horizontal driving voltage line HDL and the conductive line HCL may include the same material.

The data line DL may extend in the second direction (e.g., the y direction). The data line DL may be adjacent to the vertical driving voltage line VDL. The data line DL may be electrically connected to the switching transistor T2 through a first medium metal CMM1 and a second medium metal CMM2. As an example, the first medium metal CMM1 may be connected to the switching semiconductor of the switching transistor T2 through a contact hole 156, the second medium metal CMM2 may be connected to the first medium metal CMM1 through a contact hole 161, and the data line DL may be connected to the second medium metal CMM2 through a contact hole 171.

The vertical conductive line VCL may have a suitable voltage level (e.g., a preset voltage level). The vertical conductive line VCL may have different voltage levels depending on the position of the sub-pixel circuit PC. For example, in embodiments in which the sub-pixel circuit PC is arranged around the transmissive area TA (see, e.g., FIG. 3), the vertical conductive line VCL may have a voltage level of a constant voltage (e.g., the driving voltage). In embodiments in which the sub-pixel circuit PC is arranged on (or at) the left and right of the transmissive area TA, the vertical conductive line VCL may be electrically connected to the second driving voltage input part 2022 described, for example, with reference to FIG. 3.

Figure 7:
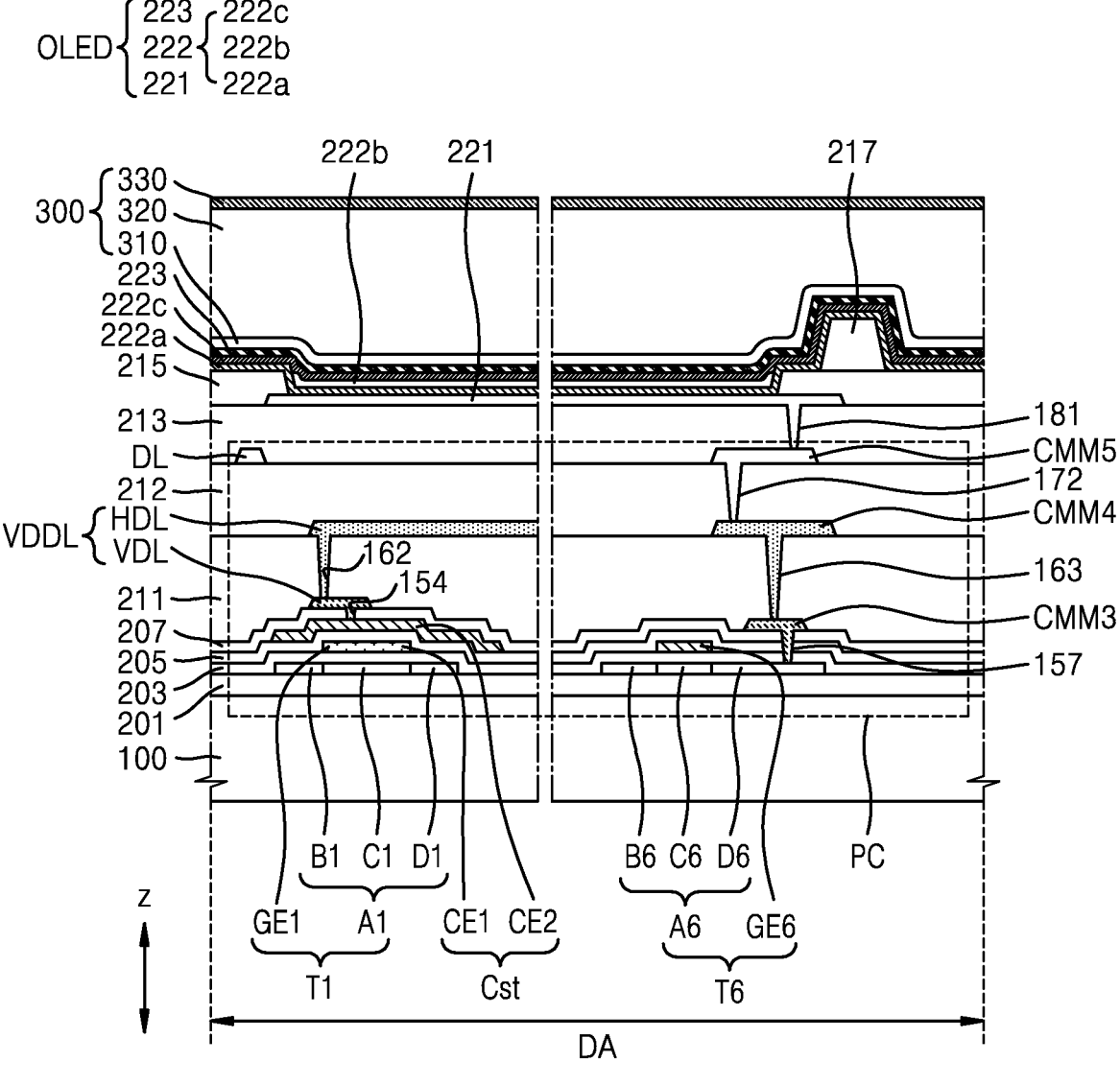
FIG. 7 is a schematic cross-sectional view of a structure arranged in a display area of the display panel according to one or more embodiments of the present disclosure.

FIG. 7 is a schematic cross-sectional view of a structure arranged in the display area DA of the display panel according to one or more embodiments of the present disclosure.

Referring to FIG. 7, the organic light-emitting diode OLED is arranged in the display area DA, and the organic light-emitting diode OLED may be electrically connected to the sub-pixel circuit PC. The sub-pixel circuit PC may be disposed between the substrate 100 and the organic light-emitting diode OLED in a direction (e.g., a z direction) perpendicular to the substrate 100.

The substrate 100 may include glass or a polymer resin. In one or more embodiments, the substrate 100 may have a stack structure in which a base layer including a polymer resin and a barrier layer including an inorganic insulating material such as silicon oxide or silicon nitride are alternately stacked. The polymer resin may include polyethersulfone, polyarylate, polyetherimide, polyethylene naphthalate, polyethylene terephthalate, polyphenylene sulfide, polyimide, polycarbonate, cellulose tri acetate, cellulose acetate propionate, and/or one or more other suitable materials.

A buffer layer 201 may be formed on (or at) the substrate 100 before the sub-pixel circuit PC is formed to prevent (or substantially prevent) impurities from penetrating to the sub-pixel circuit PC. The buffer layer 201 may include an inorganic insulating material such as silicon nitride, silicon oxynitride, and/or silicon oxide, and may include a single-layered structure or a multi-layered structure including the above inorganic insulating material(s).

The sub-pixel circuit PC may include the plurality of transistors and the storage capacitor as described above with reference to FIGS. 5 and 6. With regard to this, FIG. 7 shows the driving transistor T1, the emission control transistor T6, and the storage capacitor Cst.

The driving transistor T1 may include a driving semiconductor A1 and the driving gate electrode GE1, wherein the driving semiconductor A1 is on the buffer layer 201, and the driving gate electrode GE1 overlaps a channel region C1 of the driving semiconductor A1. The driving semiconductor A1 may include a silicon-based semiconductor material, for example, polycrystalline silicon. The driving semiconductor A1 may include the channel region C1, a first region B1, and a second region D1 respectively arranged on (or at) two opposite sides of the channel region C1. The first region B1 and the second region D1 are regions including impurities of higher concentration than that of the channel region C1. One of the first region B1 or the second region D1 may correspond to a source region, and the other may correspond to a drain region.

The emission control transistor T6 may include an emission control semiconductor A6 and an emission control gate electrode GE6, wherein the emission control semiconductor A6 is on the buffer layer 201, and the emission control gate electrode GE6 overlaps a channel region C6 of the emission control semiconductor A6. The emission control semiconductor A6 may include the channel region C6, a first region B6, and a second region D6 respectively arranged on (or at)

two opposite sides of the channel region C6. The first region B6 and the second region D6 are regions including impurities of higher concentration than that of the channel region C6. One of the first region B6 or the second region D6 may correspond to a source region, and the other may correspond to a drain region.

The driving gate electrode GE1 and the emission control gate electrode GE6 may be disposed on (or at) the same layer. As described with reference to FIG. 6, the emission control gate electrode GE6 may correspond to a portion of the emission control line EL (see, e.g., FIG. 6). Accordingly, the driving gate electrode GE1 and the emission control line EL (see, e.g., FIG. 6) may be disposed on (or at) the same layer (e.g., a gate insulating layer 203). As described with reference to FIG. 6, the first capacitor electrode CE1, the scan line SL, the previous scan line SL−1, and the next scan line SL+1 may each be disposed on (or at) the gate insulating layer 203.

The driving gate electrode GE1 and the emission control gate electrode GE6 may include a conductive material including molybdenum (Mo), aluminum (Al), copper (Cu), and/or titanium (Ti) and may have a single layer structure or a multi-layered structure including the above material(s). The driving gate electrode GE1 and the emission control gate electrode GE6 may include the same material as the scan line SL, the previous scan line SL−1, and the next scan line SL+1.

A gate insulating layer 203 may be disposed between the driving semiconductor A1 and the driving gate electrode GE1, and between the emission control semiconductor A6 and the emission control gate electrode GE6. The gate insulating layer 203 may include an inorganic insulating material such as silicon nitride, silicon oxynitride, and/or silicon oxide, and may include a single-layered structure or a multi-layered structure including the above inorganic insulating material(s).

The storage capacitor Cst may include the first capacitor electrode CE1 and the second capacitor electrode CE2 overlapping each other. The first capacitor electrode CE1 of the storage capacitor Cst may include the driving gate electrode GE1.

A first interlayer insulating layer 205 may be disposed between the first capacitor electrode CE1 and the second capacitor electrode CE2 of the storage capacitor Cst. The first interlayer insulating layer 205 may include an inorganic insulating material such as silicon nitride, silicon oxynitride, and/or silicon oxide, and may include a single-layered structure or a multi-layered structure including the above inorganic insulating material(s).

The second capacitor electrode CE2 of the storage capacitor Cst may include a conductive material of a low-resistance material such as molybdenum (Mo), aluminum (Al), copper (Cu) and/or titanium (Ti), and may have a single-layered structure or a multi-layered structure including the above material(s).

Because the second capacitor electrode CE2 corresponds to a portion of the electrode voltage line CEL, the electrode voltage line CEL may include a low-resistance conductive material such as molybdenum (Mo), aluminum (Al), copper (Cu), and/or titanium (Ti), and may include a single layer or a multi-layer including the above material(s).

In one or more embodiments, like the second capacitor electrode CE2 and the electrode voltage line CEL, the conductive piece CDP and the auxiliary initialization voltage line AIL may be disposed on (or at) the first interlayer insulating layer 205. The conductive piece CDP and the auxiliary initialization voltage line AIL may include the same material as that of the second capacitor electrode CE2 and the electrode voltage line CEL.

A second interlayer insulating layer 207 may be disposed on (or at) the storage capacitor Cst. The second interlayer insulating layer 207 may include an inorganic insulating material such as silicon nitride, silicon oxynitride, and/or silicon oxide, and may include a single layer structure or a multi-layered structure including the above inorganic insulating material(s).

The emission control transistor T6 may be electrically connected to a first electrode 221 of the organic light-emitting diode OLED through a third medium metal CMM3, a fourth medium metal CMM4, and a fifth medium metal CMM5. The third medium metal CMM3 may be disposed on (or at) the second interlayer insulating layer 207, and connected to the emission control semiconductor A6 through a contact hole 157 passing through the gate insulating layer 203, the first interlayer insulating layer 205, and the second interlayer insulating layer 207.

The fourth medium metal CMM4 may be disposed on (or at) a first organic insulating layer 211, and connected to the third medium metal CMM3 through a contact hole 163 in the first organic insulating layer 211. The fifth medium metal CMM5 may be disposed on (or at) a second organic insulating layer 212, and connected to the fourth medium metal CMM4 through a contact hole 172 in the second organic insulating layer 212.

The center of the contact hole 157 passing through the gate insulating layer 203, the first interlayer insulating layer 205 and the second interlayer insulating layer 207, the center of the contact hole 163 in the first organic insulating layer 211, and the center of the contact hole 172 in the second organic insulating layer 212 may be located at different positions, respectively. As shown in FIG. 6, the center of the contact hole 157 passing through the gate insulating layer 203, the first interlayer insulating layer 205 and the second interlayer insulating layer 207, the center of the contact hole 163 in the first organic insulating layer 211, and the center of the contact hole 172 in the second organic insulating layer 212 may be apart (or separated) from each other in a plan view.

The vertical driving voltage line VDL may be disposed on (or at) the same layer (e.g., the second interlayer insulating layer 207) as the third medium metal CMM3. The node connection line NL and the initialization voltage line INL described with reference to FIG. 6 may also be disposed on (or at) the same layer (e.g., on (or at) the second interlayer insulating layer 207) as the third medium metal CMM3. The third medium metal CMM3, the node connection line NL, the vertical driving voltage line VDL, and the initialization voltage line INL may include the same material. Each of the third medium metal CMM3, the node connection line NL, the vertical driving voltage line VDL, and the initialization voltage line INL may include aluminum (Al), copper (Cu), and/or titanium (Ti), and may include a single layer or a multi-layer including the above material(s). As an example, the third medium metal CMM3, the node connection line NL, the vertical driving voltage line VDL, and the initialization voltage line INL may include a three-layered structure of a titanium layer/aluminum layer/titanium layer.

The first organic insulating layer 211 may include an organic insulating material. The organic insulating material may include acryl, benzocyclobutene (BCB), polyimide, and/or hexamethyldisiloxane (HMDSO).

The horizontal driving voltage line HDL may be disposed on (or at) the same layer (e.g., the first organic insulating layer 211) as the fourth medium metal CMM4. The horizontal driving voltage line HDL may be connected to the vertical driving voltage line VDL through a contact hole 162 in the first organic insulating layer 211. Because the vertical driving voltage line VDL is connected to the horizontal driving voltage line HDL, a voltage drop due to a resistance of the driving voltage line VDDL itself may be prevented (or reduced).

The conductive layer HCL described with reference to FIG. 6 may be disposed on (or at) the same layer (e.g., the first organic insulating layer 211) as the horizontal driving voltage line HDL and the fourth medium metal CMM4. The conductive layer HCL (see, e.g., FIG. 6), the horizontal driving voltage line HDL, and the fourth medium metal CMM4 may include the same material.

Each of the conductive layer HCL (see, e.g., FIG. 6), the horizontal driving voltage line HDL, and the fourth medium metal CMM4 may include aluminum (Al), copper (Cu), and/or titanium (Ti), and may include a single layer or a multi-layer including the above material(s). As an example, each of the conductive layer HCL (see, e.g., FIG. 6), the horizontal driving voltage line HDL, and the fourth medium metal CMM4 may include a three-layered structure of a titanium layer/aluminum layer/titanium layer.

The data line DL may be disposed on (or at) the same layer (e.g., the second organic insulating layer 212) as the fifth medium metal CMM5. The vertical conductive line VCL described above with reference to FIG. 6 may be disposed on (or at) the same layer (e.g., the second organic insulating layer 212) as the data line DL and the fifth medium metal CMM5.

The second organic insulating layer 212 may include an organic insulating material. The second organic insulating material may include an organic insulating material such as acryl, benzocyclobutene (BCB), polyimide, and/or hexamethyldisiloxane (HMDSO).

The vertical conductive line VCL (see, e.g., FIG. 6), the data line DL, and the fifth medium metal CMM5 may include the same material. Each of the vertical conductive line VCL (see, e.g., FIG. 6), the data line DL, and the fifth medium metal CMM5 may include aluminum (Al), copper (Cu), and/or titanium (Ti), and may include a single layer or a multi-layer including the above material(s). As an example, each of the vertical conductive line VCL (see, e.g., FIG. 6), the data line DL, and the fifth medium metal CMM5 may include a three-layered structure of a titanium layer/aluminum layer/titanium layer.

A third organic insulating layer 213 may be disposed on (or at) the data line DL. The third organic insulating layer 213 may include acryl, BCB, polyimide, and/or HMDSO.

A light-emitting diode, for example, the organic light-emitting diode OLED may be disposed on (or at) the third organic insulating layer 213. The first electrode 221 of the organic light-emitting diode OLED may be connected to the fifth medium metal CMM5 through a contact hole 181 in the third organic insulating layer 213.

The first electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), and/or a compound thereof. In one or more embodiments, the first electrode 221 may further include a conductive oxide material layer on and/or under the reflective layer. The conductive oxide material layer may include indium tin oxide (ITO), indium zinc oxide (IZO), zinc oxide (ZnO), indium oxide ($In_2O_3$), indium gallium oxide (IGO), and/or aluminum zinc oxide (AZO). In one or more embodiments, the first electrode 221 may have a triple-layered structure of ITO layer/Ag layer/ITO layer.

A bank layer 215 may be disposed on (or at) the first electrode 221. The bank layer 215 may include an opening that overlaps the first electrode 221 and may cover the edges of the first electrode 221. The bank layer 215 may include an organic insulating material.

An intermediate layer 222 includes an emission layer 222*b*. The intermediate layer 222 may include a first functional layer 222*a* and/or a second functional layer 222*c*, wherein the first functional layer 222*a* is under the emission layer 222*b*, and the second functional layer 222*c* is on the emission layer 222*b*. The emission layer 222*b* may include a polymer organic material and/or a low-molecular weight organic material emitting light having a desired color (e.g., a preset color). The second functional layer 222*c* may include an electron transport layer (ETL) and/or an electron injection layer (EIL). The first functional layer 222*a* and the second functional layer 222*c* may each include an organic material.

The second electrode 223 may include a conductive material having a low work function. As an example, the second electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), and/or an alloy thereof. In one or more embodiments, the second electrode 223 may further include a layer on the (semi) transparent layer, the layer including ITO, IZO, ZnO, and/or $In_2O_3$.

The emission layer 222*b* may be formed in the display area DA to overlap the first electrode 221 through the opening of the bank layer 215. In contrast, the first functional layer 222*a*, the second functional layer 222*c*, and the second electrode 223 may cover the display area DA entirely.

A spacer 217 may be formed on (or at) the bank layer 215. The spacer 217 may be formed together during the same process as a process of forming the bank layer 215, or formed separately during a separate process. In one or more embodiments, the spacer 217 may include an organic insulating material such as polyimide.

The organic light-emitting diode OLED may be covered by an encapsulation layer 300. The encapsulation layer 300 may include at least one organic encapsulation layer and at least one inorganic encapsulation layer. In one or more embodiments, the encapsulation layer 300 may include first and second inorganic encapsulation layers 310 and 330, and an organic encapsulation layer 320 therebetween, as shown in FIG. 7, for example.

The first and second inorganic encapsulation layers 310 and 330 may include at least one inorganic material among aluminum oxide, titanium oxide, tantalum oxide, hafnium oxide, zinc oxide, silicon oxide, silicon nitride, silicon oxynitride, and/or one or more other suitable materials. The first and second inorganic encapsulation layer 310 and 330 may include a single layer or a multi-layer including the above material(s). The organic encapsulation layer 320 may include a polymer-based material. The polymer-based material may include an acryl-based resin, an epoxy-based resin, polyimide, and/or polyethylene. In one or more embodiments, the organic encapsulation layer 320 may include acrylate.

Figure 8:
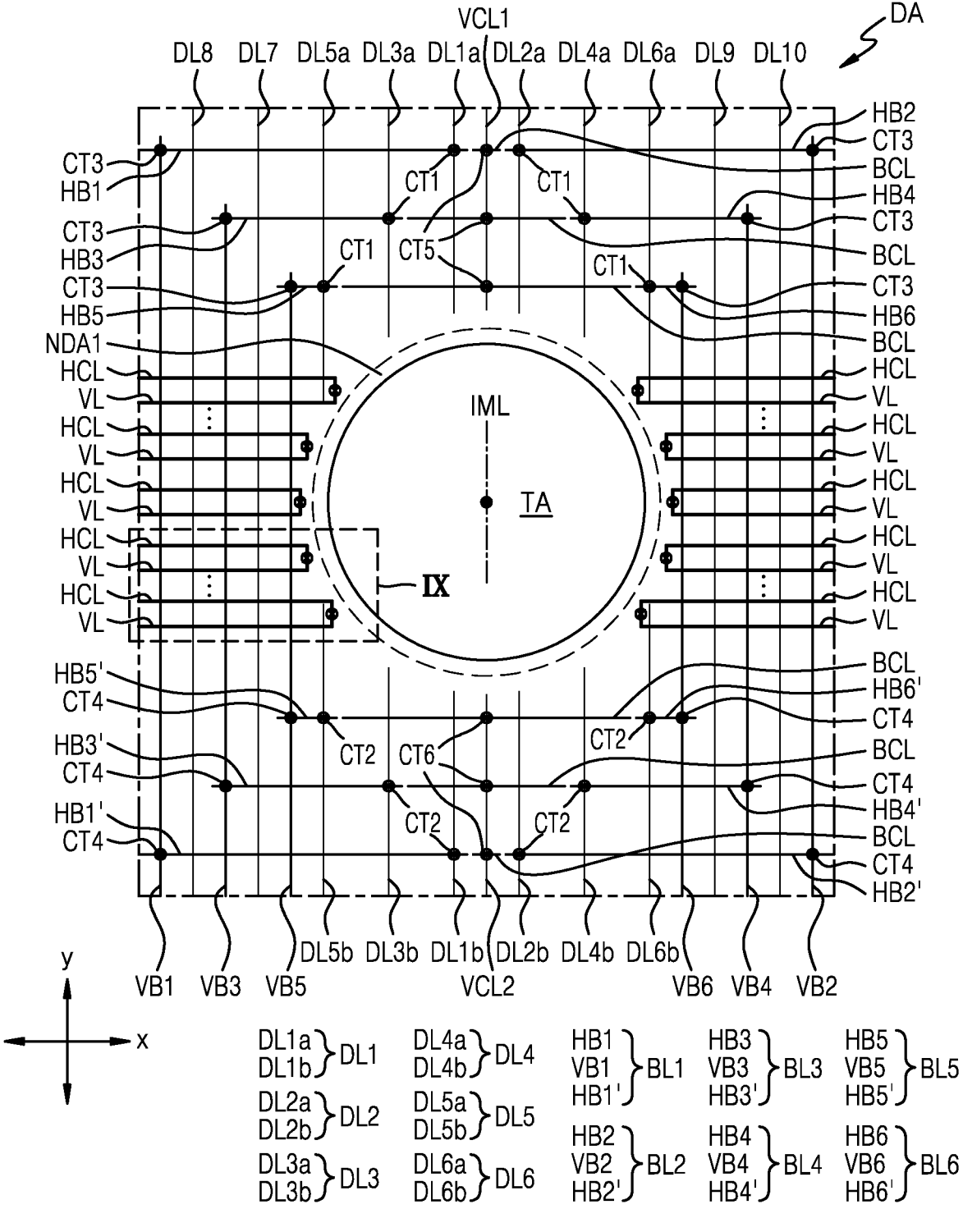
FIG. 8 is a schematic plan view of a portion of the transmissive area of the display panel and the display area adjacent to the transmissive area according to one or more embodiments of the present disclosure.

FIG. 8 is a schematic plan view of a portion of the transmissive area TA of the display panel and the display area DA adjacent to the transmissive area according to one or more embodiments of the present disclosure.

Referring to FIG. 8, lines on the upper side and lower side of the transmissive area TA may be separated or apart from each other with the transmissive area TA therebetween. As an example, first to sixth data lines DL1, DL2, DL3, DL4, DL5, and DL6 may each be disposed on (or at) the upper side and lower side of the transmissive area TA and separated or apart from each other.

Lines on the left side and right side of the transmissive area TA may be separated or apart from each other with the transmissive area TA therebetween. As an example, the conductive line HCL on the left side of the transmissive area TA may be separated or apart from the conductive line HCL on the right side of the transmissive area TA.

First, the data lines on the upper side and the lower side of the transmissive area TA are described.

Data lines extend in the second direction (e.g., the y direction), and some of the data lines may include portions apart (or separated) from each other with the transmissive area TA therebetween. With regard to this, it is shown in FIG. 8 that first to sixth data lines DL1, DL2, DL3, DL4, DL5, and DL6 each extend in the second direction (e.g., they direction) and respectively include first parts DL1$a$, DL2$a$, DL3$a$, DL4$a$, DL5$a$, and DL6$a$ and second parts DL1$b$, DL2$b$, DL3$b$, DL4$b$, DL5$b$, and DL6$b$. Referring to FIG. 8, seventh to tenth data lines DL7, DL8, DL9, and DL10 may each be apart (or separated) from the transmissive area TA in the second direction (the x direction) and may extend in the second direction (e.g., the y direction).

The first part and the second part of the data line apart (or separated) from each other with the transmissive area TA therebetween may be electrically connected to each other through a bridge line located in the display area DA. As an example, the first part DL1$a$ of the first data line DL1 may be electrically connected to the second part DL1$b$ through a first bridge line BL1.

The first bridge line BL1 may include a first vertical bridge part VB1 and a pair of first horizontal bridge parts HB1 and HB1', wherein the first vertical bridge part VB1 extends in the second direction (e.g., they direction), and the pair of first horizontal bridge parts HB1 and HB1' are respectively disposed on (or at) two opposite sides of the first vertical bridge part VB1 and extend in the first direction (e.g., the x direction). The first vertical bridge part VB1 may be disposed on (or at) a layer different from a layer on (or at) which the pair of first horizontal bridge parts HB1 and HB1' are disposed. As an example, the first vertical bridge part VB1 may be formed on (or at) the second organic insulating layer 212 described with reference to FIG. 7, and the pair of first horizontal bridge parts HB1 and HB1' may be formed under the second organic insulating layer 212 (e.g., on the first organic insulating layer 211).

A first end of one of the first horizontal bridge parts HB1 (referred to as a first upper horizontal bridge part, hereinafter) may cross a first part DL1$a$ of the first data line DL1, and may be electrically connected to the first part DL1$a$ of the first data line DL1 through a first contact hole CT1. A second end of the first upper horizontal bridge part HB1 may cross the first vertical bridge part VB1, and may be electrically connected to the first vertical bridge part VB1 through a third contact hole CT3. The first contact hole CT1 may be defined in a portion of an insulating layer (e.g., the second organic insulating layer 212 shown in FIG. 7) disposed between the first end of the first upper horizontal bridge part HB1 and the first part DL1$a$ of the first data line DL1, and the third contact hole CT3 may be defined in a portion of an insulating layer (e.g., the second organic insulating layer 212 shown in FIG. 7) disposed between the second end of the first upper horizontal bridge part HB1 and the first vertical bridge part VB1.

A first end of one of the first horizontal bridge parts HB1' (referred to as a first lower horizontal bridge part, hereinafter) may cross a second part DL1$b$ of the first data line DL1, and may be electrically connected to the second part DL1$b$ of the first data line DL1 through a second contact hole CT2. A second end of the first lower horizontal bridge part HB1' may cross the first vertical bridge part VB1, and may be electrically connected to the first vertical bridge part VB1 through a fourth contact hole CT4. The second contact hole CT2 may be defined in a portion of an insulating layer (e.g., the second organic insulating layer 212 shown in FIG. 7) disposed between the first end of the first lower horizontal bridge part HB1' and the second part DL1$b$ of the first data line DL1, and the fourth contact hole CT4 may be defined in a portion of an insulating layer (e.g., the second organic insulating layer 212 shown in FIG. 7) disposed between the second end of the first lower horizontal bridge part HB1' and the first vertical bridge part VB1.

The first contact hole CT1 and the second contact hole CT2, which are connection points of the pair of first horizontal bridge parts HB1 and HB1' and the first and second parts DL1$a$ and DL1$b$ of the first data line DL1, and the third contact hole CT3 and the fourth contact hole CT4, which are connection points of the pair of first horizontal bridge parts HB1 and HB1' and the first vertical bridge part VB1, may be located in the display area DA. Because the first to fourth contact holes CT1, CT2, CT3, and CT4 utilize the display area DA, the area of the first non-display area NDA1, which is a dead space, may be reduced.

The first part DL2$a$ of the second data line DL2 may be electrically connected to the second part DL2$b$ through a second bridge line BL2.

The second bridge line BL2 may include a second vertical bridge part VB2 and a pair of second horizontal bridge parts HB2 and HB2', wherein the second vertical bridge part VB2 extends in the second direction (e.g., the y direction), and the pair of second horizontal bridge parts HB2 and HB2' are respectively disposed on (or at) two opposite sides of the second vertical bridge part VB2 and extend in the first direction (e.g., the x direction). The second vertical bridge part VB2 may be disposed on (or at) a layer different from a layer on (or at) which the pair of second horizontal bridge parts HB2 and HB2' are disposed.

A first end of one of the second horizontal bridge parts HB2 (referred to as a second upper horizontal bridge part, hereinafter) may cross a first part DL2$a$ of the second data line DL2, and may be electrically connected to the first part DL2$a$ through the first contact hole CT1, and a second end of the second upper horizontal bridge part HB2 may cross the second vertical bridge part VB2, and may be electrically connected to the second vertical bridge part VB2 through a third contact hole CT3.

A first end of another of the second horizontal bridge parts HB2' (referred to as a second lower horizontal bridge part, hereinafter) may cross a second part DL2$b$ of the second data line DL2, and may be electrically connected to the second part DL2$b$ through the second contact hole CT2, and a second end of the second lower horizontal bridge part HB2' may cross the second vertical bridge part VB2, and may be electrically connected to the second vertical bridge part VB2 through a fourth contact hole CT3.

The first contact hole CT1 and the second contact hole CT2, which are connection points of the pair of second horizontal bridge parts HB2 and HB2' and the first and second parts DL2a and DL2b of the second data line DL2, and the third contact hole CT3 and the fourth contact hole CT4, which are connection points of the pair of second horizontal bridge parts HB2 and HB2' and the second vertical bridge part VB2, may be located in the display area DA.

The first bridge line BL1 and the second bridge line BL2 electrically connected to the first data line DL1 and the second data line DL2 adjacent to each other, respectively, may be located opposite to each other with the transmissive area TA therebetween. As an example, the first bridge line BL1 may be disposed on (or at) one side (e.g., the left side in FIG. 8) of the transmissive area TA, and the second bridge line BL2 may be disposed on (or at) another side (e.g., the right side in FIG. 8) of the transmissive area TA.

A conductive line BCL (referred to as a gap conductive line, hereinafter) may be arranged between the end of the first bridge line BL1 and the end of the second bridge line BL2. As an example, the gap conductive line BCL may be disposed between the first end of the first upper horizontal bridge part HB1 of the first bridge line BL1 and the first end of the second upper horizontal bridge part HB2 of the second bridge line BL2. The gap conductive line BCL may be located between the first upper horizontal bridge part HB1 and the second upper horizontal bridge part HB2 while apart (or separated) from the first upper horizontal bridge part HB1 and the second upper horizontal bridge part HB2.

The gap conductive line BCL may be located between the first lower horizontal bridge part HB1' and the second lower horizontal bridge part HB2' while apart (or separated) from the first lower horizontal bridge part HB1' and the second lower horizontal bridge part HB2'.

The first part DL3a of the third data line DL3 may be electrically connected to the second part DL3b through a third bridge line BL3.

The third bridge line BL3 may include a third vertical bridge part VB3 and a pair of third horizontal bridge parts HB3 and HB3', wherein the third vertical bridge part VB3 extends in the second direction (e.g., the y direction), and the pair of third horizontal bridge parts HB3 and HB3' are respectively disposed on (or at) two opposite sides of the third vertical bridge part VB3 and extend in the first direction (e.g., the x direction). The third vertical bridge part VB3 may be disposed on (or at) a layer different from a layer on which the pair of third horizontal bridge parts HB3 and HB3' are disposed.

A first end of the third upper horizontal bridge part HB3 may cross the first part DL3a of the third data line DL3 and be electrically connected to the first part DL3a of the third data line DL3 through the first contact hole CT1, and a second end of the third upper horizontal bridge part HB3 may cross the third vertical bridge part VB3 and be electrically connected to the third vertical bridge part VB3 through the third contact hole CT3.

The first end of a third lower horizontal bridge part HB3' may cross a second part DL3b of the third data line DL3, and be electrically connected to a second part DL3b of the third data line DL3 through the second contact hole CT2. A second end of the third lower horizontal bridge part HB3' may cross the third vertical bridge part VB3, and may be electrically connected to the third vertical bridge part VB3 through the fourth contact hole CT4.

The first part DL4a of the fourth data line DL4 may be electrically connected to the second part DL4b through a fourth bridge line BL4.

The fourth bridge line BL4 may include a fourth vertical bridge part VB4 and a pair of fourth horizontal bridge parts HB4 and HB4', wherein the fourth vertical bridge part VB4 extends in the second direction (e.g., the y direction), and the pair of fourth horizontal bridge parts HB4 and HB4' are respectively disposed on (or at) two opposite sides of the fourth vertical bridge part VB4 and extend in the first direction (e.g., the x direction). The fourth vertical bridge part VB4 may be disposed on (or at) a layer different from a layer on which the pair of fourth horizontal bridge parts HB4 and HB4' are disposed.

The first end of a fourth upper horizontal bridge part HB4 may cross a first part DL4a of the fourth data line DL4, and be electrically connected to a first part DL4a of the fourth data line DL4 through the first contact hole CT1. A second end of the fourth upper horizontal bridge part HB4 may cross the fourth vertical bridge part VB4, and may be electrically connected to the fourth vertical bridge part VB4 through the third contact hole CT3.

The first end of a fourth lower horizontal bridge part HB4' may cross a second part DL4b of the fourth data line DL4, and be electrically connected to a second part DL4b of the fourth data line DL4 through the second contact hole CT2. A second end of the fourth lower horizontal bridge part HB4' may cross the fourth vertical bridge part VB4, and may be electrically connected to the fourth vertical bridge part VB4 through the fourth contact hole CT4.

The third bridge line BL3 and the fourth bridge line BL4 respectively connected to the third data line DL3 and the fourth data line DL4 may be located opposite each other with the transmissive area TA therebetween. As an example, the third bridge line BL3 may be disposed on (or at) one side (e.g., the left side in FIG. 8) of the transmissive area TA, and the fourth bridge line BL4 may be disposed on (or at) another side (e.g., the right side in FIG. 8) of the transmissive area TA.

A gap conductive line BCL may be arranged between the end of the third bridge line BL3 and the end of the fourth bridge line BL4. As an example, the gap conductive line BCL may be disposed between the first end of the third upper horizontal bridge part HB3 of the third bridge line BL3 and the first end of the fourth upper horizontal bridge part HB4 of the fourth bridge line BL4. The gap conductive line BCL may be located between the third upper horizontal bridge part HB3 and the fourth upper horizontal bridge part HB4 while apart (or separated) from the third upper horizontal bridge part HB3 and the fourth upper horizontal bridge part HB4.

The gap conductive line BCL may be located between the third lower horizontal bridge part HB3' and the fourth lower horizontal bridge part HB4' while apart (or separated) from the third lower horizontal bridge part HB3' and the fourth lower horizontal bridge part HB4'.

The first part DL5a of the fifth data line DL5 may be electrically connected to the second part DL5b through a fifth bridge line BL5.

The fifth bridge line BL5 may include a fifth vertical bridge part VB5 and a pair of fifth horizontal bridge parts HB5 and HB5', wherein the fifth vertical bridge part VB5 extends in the second direction (e.g., the y direction), and the pair of fifth horizontal bridge parts HB5 and HB5' are respectively disposed on (or at) two opposite sides of the fifth vertical bridge part VB5 and extend in the first direction (e.g., the x direction). The fifth vertical bridge part VB5 may be disposed on (or at) a layer different from a layer on (or at) which the pair of fifth horizontal bridge parts HB5 and HB5' are disposed.

The first end of a fifth upper horizontal bridge part HB5 may cross a first part DL5a of the fifth data line DL5, and be electrically connected to a first part DL5a of the fifth data line DL5 through the first contact hole CT1. A second end of the fifth upper horizontal bridge part HB5 may cross the fifth vertical bridge part VB5, and may be electrically connected to the fifth vertical bridge part VB5 through the third contact hole CT3.

The first end of a fifth lower horizontal bridge part HB5' may cross a second part DL5b of the fifth data line DL5, and be electrically connected to a second part DL5b of the fifth data line DL5 through the second contact hole CT2. A second end of the fifth lower horizontal bridge part HB5' may cross the fifth vertical bridge part VB5, and may be electrically connected to the fifth vertical bridge part VB5 through the fourth contact hole CT4.

The first part DL6a of the sixth data line DL6 may be electrically connected to the second part DL6b through a sixth bridge line BL6.

The sixth bridge line BL6 may include a sixth vertical bridge part VB6 and a pair of sixth horizontal bridge parts HB6 and HB6', wherein the sixth vertical bridge part VB6 extends in the second direction (e.g., the y direction), and the pair of sixth horizontal bridge parts HB6 and HB6' are respectively disposed on (or at) two opposite sides of the sixth vertical bridge part VB6 and extend in the first direction (e.g., the x direction). The sixth vertical bridge part VB6 may be disposed on (or at) a layer different from a layer on which the pair of sixth horizontal bridge parts HB6 and HB6' are disposed.

The first end of a sixth upper horizontal bridge part HB6 may cross a first part DL6a of the sixth data line DL6, and be electrically connected to a first part DL6a of the sixth data line DL6 through the first contact hole CT1. A second end of the sixth upper horizontal bridge part HB6 may cross the sixth vertical bridge part VB6, and may be electrically connected to the sixth vertical bridge part VB6 through the third contact hole CT3.

The first end of a sixth lower horizontal bridge part HB6' may cross a second part DL6b of the sixth data line DL6, and be electrically connected to a second part DL6b of the sixth data line DL6 through the second contact hole CT2. A second end of the sixth lower horizontal bridge part HB6' may cross the sixth vertical bridge part VB6, and may be electrically connected to the sixth vertical bridge part VB6 through the fourth contact hole CT4.

The fifth bridge line BL5 and the sixth bridge line BL6 respectively connected to the fifth data line DL5 and the sixth data line DL6 may be located opposite each other with the transmissive area TA therebetween. As an example, the fifth bridge line BL5 may be disposed on (or at) one side (e.g., the left side in FIG. 8) of the transmissive area TA, and the sixth bridge line BL6 may be disposed on (or at) another side (e.g., the right side in FIG. 8) of the transmissive area TA.

The gap conductive line BCL may be arranged between the end of the fifth bridge line BL5 and the end of the sixth bridge line BL6. As an example, the gap conductive line BCL may be disposed between the first end of the fifth upper horizontal bridge part HB5 of the fifth bridge line BL5 and the first end of the sixth upper horizontal bridge part HB6 of the sixth bridge line BL6. The gap conductive line BCL may be located between the fifth upper horizontal bridge part HB5 and the sixth upper horizontal bridge part HB6 while apart (or separated) from the fifth upper horizontal bridge part HB5 and the sixth upper horizontal bridge part HB6.

The gap conductive line BCL may be located between the fifth lower horizontal bridge part HB5' and the sixth lower horizontal bridge part HB6' while apart (or separated) from the fifth lower horizontal bridge part HB5' and the sixth lower horizontal bridge part HB6'.

The gap conductive lines BCL may be located opposite each other with the transmissive area TA therebetween. The gap conductive lines BCL arranged on (or at) the same side with respect to the transmissive area TA may have different lengths. As an example, the gap conductive lines BCL arranged on (or at) the upper side of the transmissive area TA may have different lengths, and the gap conductive lines BCL arranged on (or at) the lower side of the transmissive area TA may have different lengths.

As an example, the length of the gap conductive lines BCL may decrease or increase as the gap conductive lines BCL are away in the second direction (e.g., the y direction) from the transmissive area TA. In one or more embodiments, as shown in FIG. 8, the lengths of the gap conductive lines BCL may be reduced as the gap conductive lines BCL are located farther away from the transmissive area TA. In other embodiments, the lengths of the gap conductive lines BCL may increase as the gap conductive lines BCL are located farther away from the transmissive area TA.

The gap conductive lines BCL may be electrically connected to a voltage line, for example, a first vertical conductive line VCL1 and a second vertical conductive line VCL2, and may have a suitable voltage level (e.g., a preset voltage level). At least one first vertical conductive line VCL1 extending in the second direction (e.g., the y direction) may be arranged on (or at) the upper side of the transmissive area TA, and at least one second vertical conductive line VCL2 extending in the second direction (e.g., they direction) may be arranged on (or at) the lower side of the transmissive area TA. Though it is shown in FIG. 8 that one first vertical conductive line VCL1 and one second vertical conductive line VCL2 are arranged, the present disclosure is not limited thereto. In one or more embodiments, a plurality of first vertical conductive lines VCL1 and a plurality of second vertical conductive lines VCL2 may be respectively arranged on (or at) the upper side and the lower side of the transmissive area TA.

As a comparative example, in the case where the gap conductive lines BCL are electrically floated, the gap conductive lines BCL may be vulnerable to electrostatic discharge. However, according to one or more embodiments, because the gap conductive lines BCL have a suitable voltage level (e.g., a preset voltage level or a constant voltage), the above issue may be prevented or reduced.

The gap conductive lines BCL on the upper side of the transmissive area TA may be connected to at least one first vertical conductive line VCL1 through a fifth contact hole CT5. The gap conductive lines BCL on the lower side of the transmissive area TA may be connected to at least one second vertical conductive line VCL2 through a sixth contact hole CT6. The first vertical conductive line VCL1 or the second vertical conducive line VCL2 may have a voltage level of the common voltage ELVSS or the driving voltage ELVDD described, for example, with reference to FIG. 5. Each of the first vertical conductive line VCL1 and the second vertical conducive line VCL2 may pass across the sub-pixel circuit, and be disposed on (or at) the position of the vertical conductive line VCL described above with reference to FIG. 6. In other words, the first vertical conductive line VCL1 may pass across at least one sub-pixel circuit arranged on (or at) the upper side of the transmissive area TA, and the position of the first vertical conductive line VCL1 may correspond to the position of the vertical conductive line VCL described above with reference to FIG. 6. Similarly, the second vertical conductive line VCL2 may pass across at least one sub-pixel circuit arranged on (or at) the lower side of the transmissive area TA, and the position of the second vertical conductive line VCL2 may correspond to the position of the vertical conductive line VCL described above with reference to FIG. 6.

Next, conductive lines HCL on the left and right of the transmissive area TA according to FIG. 8 are described.

The conductive lines HCL shown in FIG. 8 may be separated or apart from each other with the transmissive area TA therebetween. As an example, two conductive lines HCL arranged on (or at) the same row may be respectively arranged on (or at) the left and right of the transmissive area TA and separated or apart from each other.

The conductive lines HCL arranged on (or at) the left of the transmissive area TA and the conductive lines HCL arranged on (or at) the right of the transmissive area TA may each be electrically connected to the voltage line VL. As an example, one conductive line HCL on the left of the transmissive area TA and another conductive line HCL on the right of the transmissive area TA may be arranged on (or at) the same row, and separated or apart from each other with the transmissive area TA therebetween. The two conductive lines HCL may each be electrically connected to two voltage lines VL. In this case, the two voltage lines VL may be also separated or apart from each other with the transmissive area TA therebetween.

As a comparative example, in the case where the conductive lines HCL are not electrically connected to the voltage line VL and are electrically floated, the surroundings of (or the area around) the transmissive area TA may be damaged by electrostatic discharge introduced to the surroundings of (or the area around) the transmissive area TA. In contrast, according to one or more embodiments, because each conductive line HCL arranged around the transmissive area TA is electrically connected to the voltage line VL, the above issue may be prevented or reduced.

The voltage line VL may have a voltage level of a constant voltage. As an example, the voltage line VL may be the horizontal driving voltage line HDL described, for example, with reference to FIG. 6, and which is also described, for example, with reference to FIGS. 9 and 10. In one or more embodiments, the voltage line VL may be the electrode voltage line CEL described, for example, with reference to FIG. 6, and which is also described, for example, in a relevant section with reference to FIGS. 11 to 12B. In one or more embodiments, the voltage line VL may be the vertical driving voltage line VDL described, for example, with reference to FIG. 6, and which is also described, for example, in a relevant section with reference to FIGS. 13 to 14B.

Figure 9:
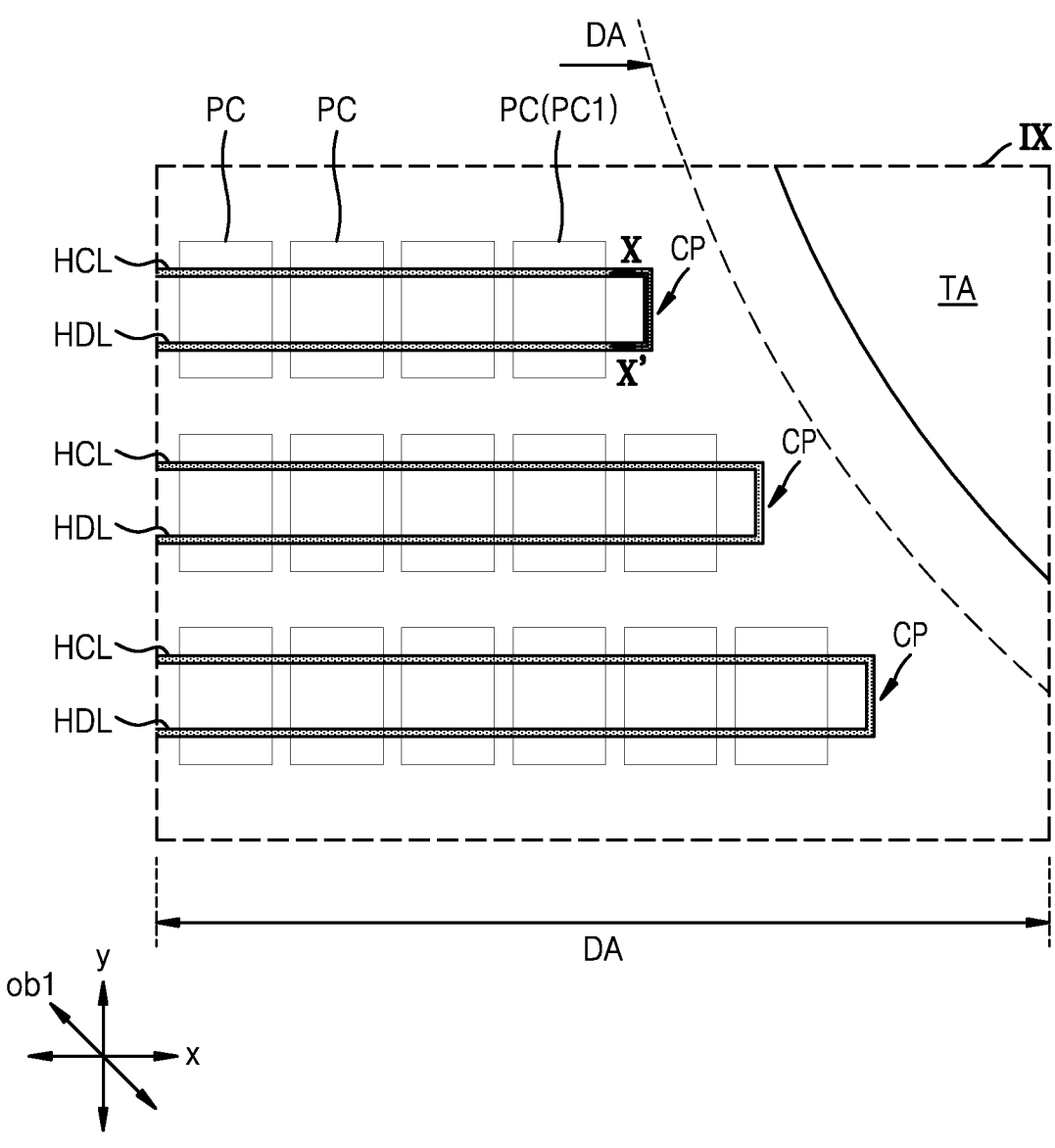
FIG. 9 is a plan view of a portion of the display panel according to one or more embodiments of the present disclosure, the portion corresponding to a region IX of FIG. 8.
Figure 10:
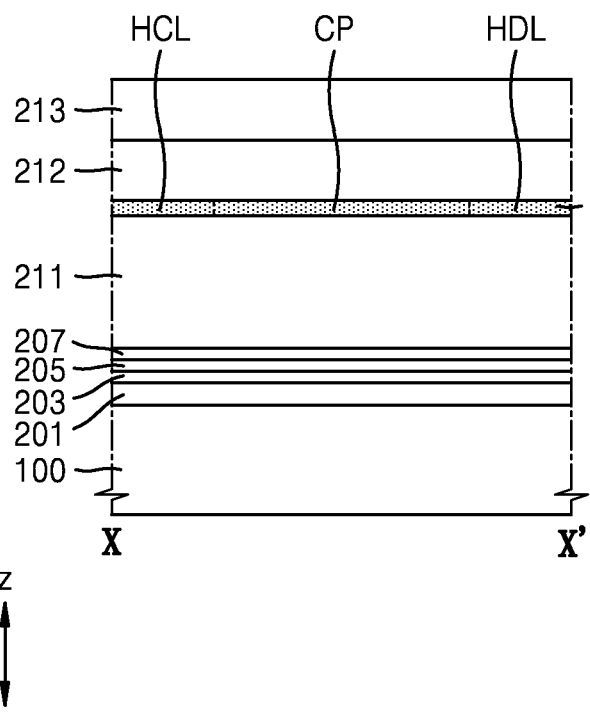
FIG. 10 is a cross-sectional view of the display panel, taken along the line X-X' of FIG. 9.

FIG. 9 is a plan view of a portion of the display panel according to one or more embodiments of the present disclosure, the portion corresponding to a region IX of FIG. 8, and FIG. 10 is a cross-sectional view of the display panel, taken along line X-X' of FIG. 9.

Referring to FIG. 9, the conductive lines HCL may each extend in the first direction (e.g., the x direction). Each conductive line HCL may extend to pass across the sub-pixel circuits PC arranged on (or at) the same row in the first direction (e.g., the x direction). As an example, each conductive line HCL may pass across a sub-pixel circuit PC1 (referred to as a first sub-pixel circuit, hereinafter) close (e.g., closest) to the transmissive area TA, and sub-pixels PC arranged on (or at) the same row as the first sub-pixel circuit PC1. The sub-pixel circuits PC including the first sub-pixel circuit PC1 may have the structure described above with reference to FIG. 6.

The conductive lines HCL may be connected to the voltage line. In one or more embodiments, as shown, for example, in FIG. 9, each conductive line HCL may be electrically connected to the horizontal driving voltage line HDL.

Each conductive line HCL and each horizontal driving voltage line HDL may extend to pass across the sub-pixel circuits PC arranged on (or at) the same row, and be electrically connected to each other around the transmissive area TA. As an example, each conductive line HCL and each horizontal driving voltage line HDL may be physically connected to each other as one body (e.g., an integrated body). Each conductive line HCL may extend in the first direction (e.g., the x direction) and be bent around the transmissive area TA, and each horizontal driving voltage line HDL may extend in the first direction (e.g., the x direction) and be bent around the transmissive area TA. A bent portion of the conductive line HCL and a bent portion of the horizontal driving voltage line HDL may be connected to each other as one body (e.g., an integrated body).

A connection portion CP of each conductive line HCL and each horizontal driving voltage line HDL may be arranged around the transmissive area TA. As an example, the connection portion CP of each conductive line HCL and each horizontal driving voltage line HDL may be adjacent to the first sub-pixel circuit PC1 close (e.g., closest) to the transmissive area TA. The connection portion CP may be located in the display area DA.

In embodiments in which the transmissive area TA has a round shape (e.g., a circular shape or an elliptical shape) in a plan view, the sub-pixel circuits PC around the transmissive area TA may form a step configuration as shown, for example, in FIG. 9. Accordingly, the position of the end of each conductive line around the transmissive area TA may be located in a first diagonal direction ob1 that is oblique to each of the first direction (e.g., the x direction) and the second direction (e.g., the y direction). Likewise, the connection portion CP of each conductive line HCL and each horizontal driving voltage line HDL may also be located in the first diagonal direction ob1.

Referring to FIG. 10, the conductive line HCL and the horizontal driving voltage line HDL may be disposed on (or at) the same layer (e.g., the first organic insulating layer 211 as shown, for example, in FIG. 7). The conductive line HCL and the horizontal driving voltage line HDL may be connected to each other as one body (e.g., an integrated body), and the connection portion CP between the conductive line HCL and the horizontal driving voltage line HDL may be also disposed on (or at) the first organic insulating layer 211. The connection portion CP may include the same material as that of the conductive line HCL and the horizontal driving voltage line HDL, and be connected, as one body (e.g., an integrated body), to the conductive line HCL and the horizontal driving voltage line HDL.

Figure 11:
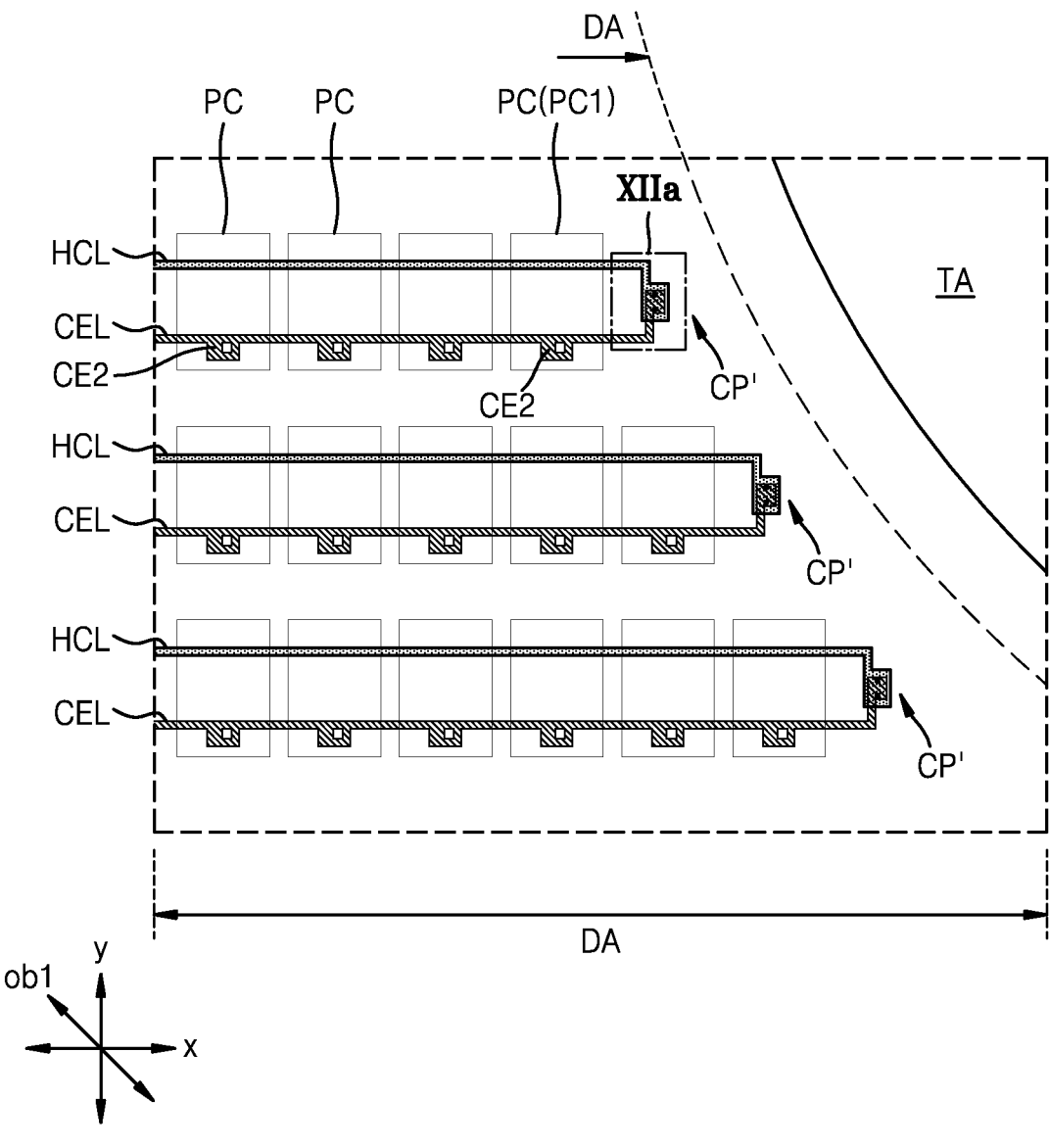
FIG. 11 is a plan view of a portion of the display panel according to one or more embodiments of the present disclosure, the portion corresponding to a modified embodiment of FIG. 9.
Figure 12A:
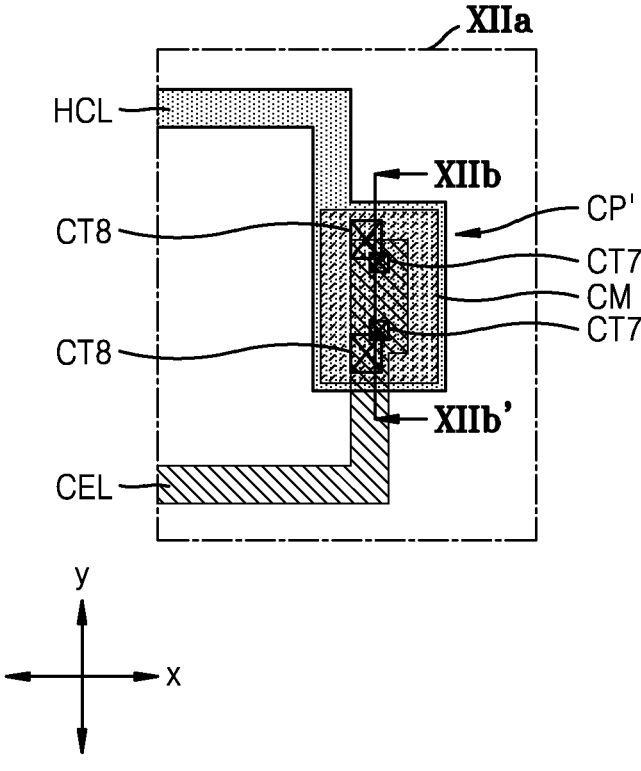
FIG. 12A is an enlarged plan view of a region XIIa of FIG. 11.
Figure 12B:
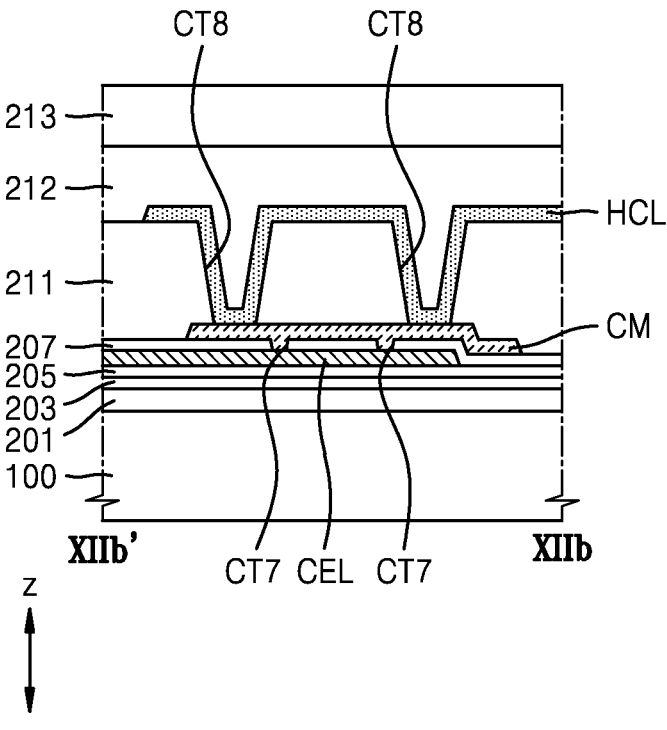
FIG. 12B is a cross-sectional view of the display panel, taken along the line XIIb-XIIb' of FIG. 12A.

FIG. 11 is a plan view of a portion of the display panel according to one or more embodiments of the present disclosure, the portion corresponding to a modified embodiment of FIG. 9. FIG. 12A is an enlarged plan view of a region XIIa of FIG. 11, and FIG. 12B is a cross-sectional view of the display panel, taken along line XIIb-XIIb' of FIG. 12A.

Referring to FIG. 11, the conductive lines HCL may each extend in the first direction (e.g., the x direction). Each conductive line HCL may extend to pass across the sub-pixel circuits PC arranged on (or at) the same row in the first direction (e.g., the x direction). As an example, each conductive line HCL may pass across the sub-pixel circuit PC1

(referred to as the first sub-pixel circuit, hereinafter) close (e.g., closest) to the transmissive area TA, and sub-pixels PC arranged on (or at) the same row as the first sub-pixel circuit PC1. The sub-pixel circuits PC including the first sub-pixel circuit PC1 may have the structure described, for example, with reference to FIG. 6.

The conductive lines HCL arranged around the transmissive area TA may be electrically connected to the voltage line, for example, the electrode voltage line CEL. Each electrode voltage line CEL may extend to pass across the sub-pixel circuits PC arranged on (or at) the same layer. Each electrode voltage line CEL passing across the plurality of sub-pixel circuits PC may include the second capacitor electrode CE2 arranged in a region corresponding to each sub-pixel circuit PC as described, for example, with reference to FIG. 6.

The conductive line HCL and the electrode voltage line CEL electrically connected to each other may pass across the sub-pixel circuits PC arranged on (or at) the same row. The conductive line HCL may be electrically connected to the electrode voltage line CEL around the transmissive area TA. A connection portion CP' between the conductive line HCL and the electrode voltage line CEL may be adjacent to the first sub-pixel circuit PC1 that is adjacent to the transmissive area TA. The connection portion CP' may be located in the display area DA.

The sub-pixel circuits PC may form a step configuration as shown, for example, in FIG. 11. Accordingly, the position of the end of each conductive line around the transmissive area TA may be located in the first diagonal direction ob1 that is oblique to each of the first direction (e.g., the x direction) and the second direction (e.g., the y direction). Likewise, the connection portion CP' of each conductive line HCL and each horizontal driving voltage line HDL may also be located in the first diagonal direction ob1.

Referring to FIG. 12A, an electrical connection portion CP' between each conductive line HCL and each electrode voltage line CEL may have a contact hole structure including a connection metal CM and an insulating layer. One end of the conductive line HCL and one end of the electrode voltage line CEL may each overlap the connection metal CM. The connection metal CM may have an isolated shape in a plan view.

Referring to FIG. 12B, the electrode voltage line CEL may be disposed on (or at) the first interlayer insulating layer 205, the connection metal CM may be disposed on (or at) the second interlayer insulating layer 207, and the conductive layer HCL may be disposed on (or at) the first organic insulating layer 211. The connection metal CM may be connected to the electrode voltage line CEL through a seventh contact hole CT7 of the second interlayer insulating layer 207, and the conductive layer HCL may be connected to the connection metal CM through an eighth contact hole CT8 of the first organic insulating layer 211. The center of the seventh contact hole CT7 may be apart (or separated) from the center of the eighth contact hole CT8.

Figure 13:
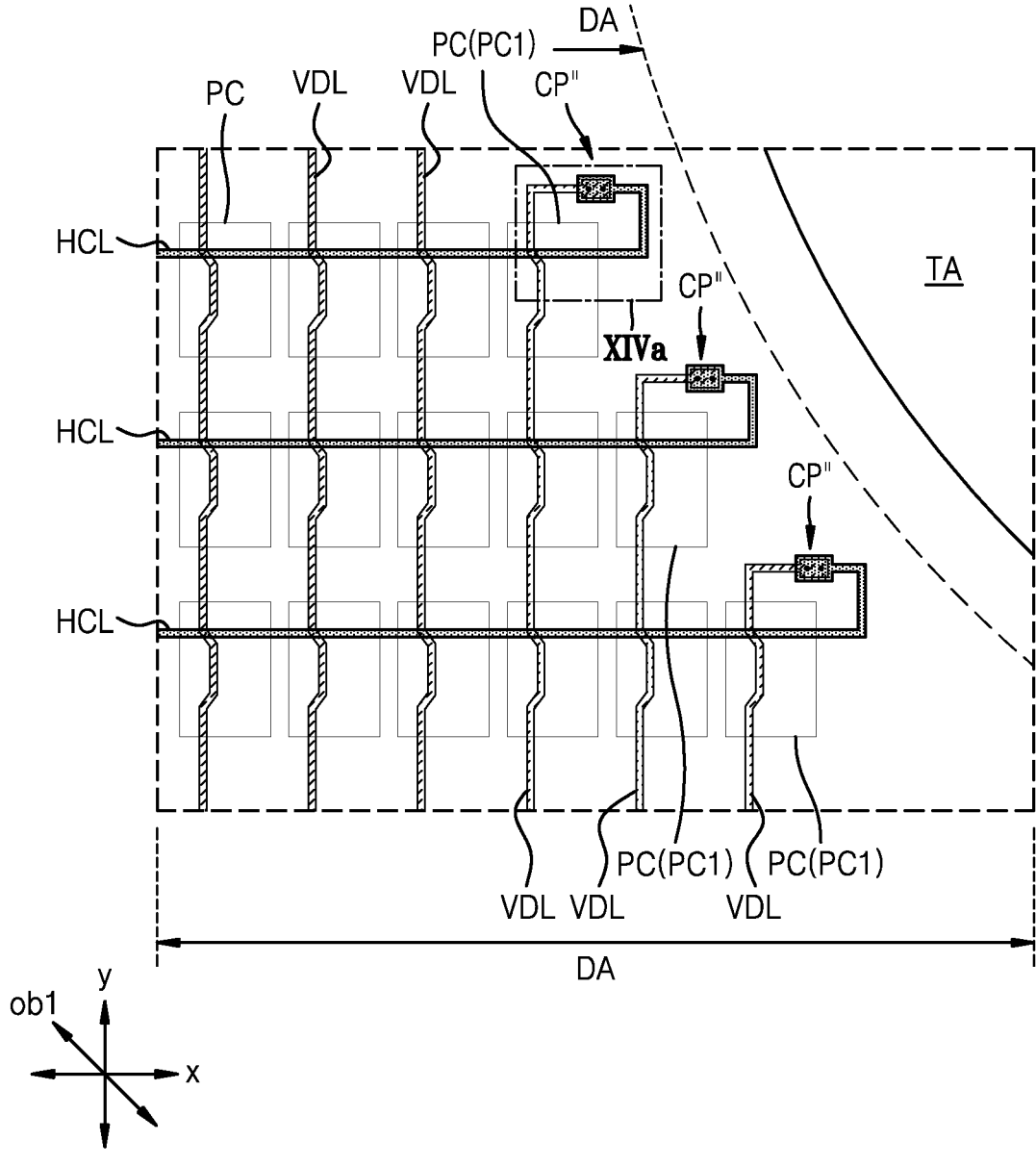
FIG. 13 is a plan view of a portion of the display panel according to one or more embodiments of the present disclosure, the portion corresponding to a modified embodiment of FIG. 9.
Figure 14A:
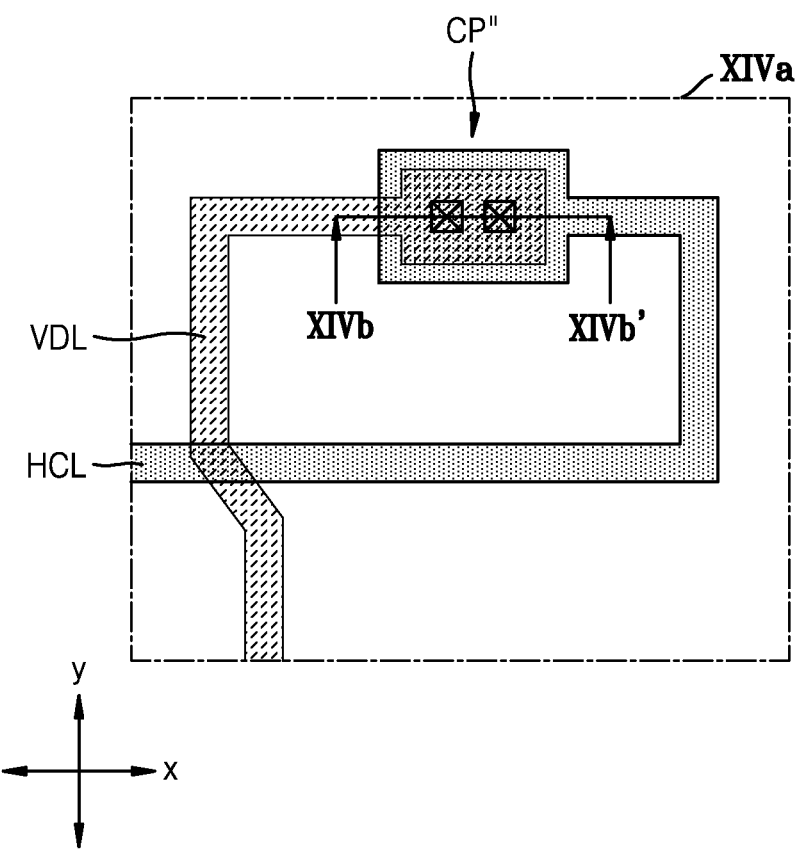
FIG. 14A is an enlarged plan view of a region XIVa of FIG. 13.
Figure 14B:
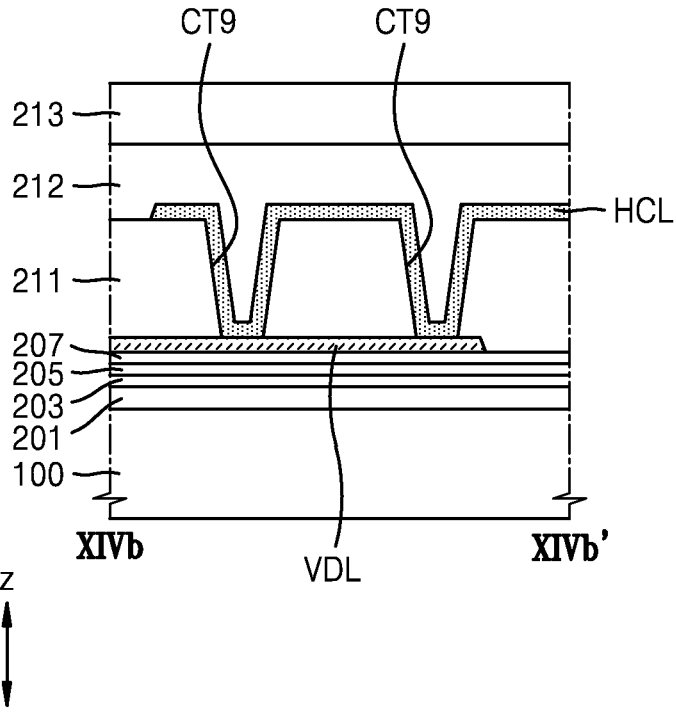
FIG. 14B is a cross-sectional view of the display panel, taken along the line XIVb-XIVb' of FIG. 14A.

FIG. 13 is a plan view of a portion of the display panel according to one or more embodiments of the present disclosure, corresponding to a modified embodiment of FIG. 9. FIG. 14A is an enlarged plan view of a region XIVa of FIG. 13, and FIG. 14B is a cross-sectional view of the display panel, taken along line XIVb-XIVb' of FIG. 14A.

Referring to FIG. 13, the conductive lines HCL may each extend in the first direction (e.g., the x direction). Each conductive line HCL may extend to pass across the sub-pixel circuits PC arranged on (or at) the same row in the first direction (e.g., the x direction). As an example, each conductive line HCL may pass across the sub-pixel circuits PC arranged on (or at) the same row. The sub-pixel circuits PC may include the structure as described, for example, with reference to FIG. 6.

The conductive lines HCL arranged around the transmissive area TA may be electrically connected to the voltage line, for example, the vertical driving voltage line VDL. The vertical driving voltage line VDL may extend to pass across the sub-pixel circuits PC arranged on (or at) the same column. The conductive line HCL may be electrically connected to the vertical driving voltage line VDL passing across the first sub-pixel circuit PC1 arranged close (e.g., closest) to the transmissive area TA among the sub-pixel circuits PC on the same row.

Each of the conductive lines HCL and the vertical driving voltage lines VDL electrically connected to each other may pass across the first sub-pixel circuit PC1 located close (e.g., closest) to the transmissive area TA. Each conductive line HCL and each vertical driving voltage line VDL may be electrically connected to each other around the transmissive area TA. An electrical connection portion CP'' between the conductive line HCL and the vertical driving voltage line VDL may be adjacent to the first sub-pixel circuit PC1 that is adjacent to the transmissive area TA. The connection portion CP'' may be located in the display area DA.

The sub-pixel circuits PC may form a step configuration as shown, for example, in FIG. 13. Accordingly, the position of the end of each conductive line around the transmissive area TA may be located in a first diagonal direction ob1 that is oblique to each of the first direction (e.g., the x direction) and the second direction (e.g., the y direction). Likewise, the connection portion CP'' of each conductive line HCL and each vertical driving voltage line VDL may also be located in the first diagonal direction ob1.

Referring to FIG. 14A, an electrical connection portion CP'' between each conductive line HCL and each vertical driving voltage line VDL may have a contact hole structure including an insulating layer. One end of the conductive line HCL may overlap one end of the vertical driving voltage line VDL.

Referring to FIG. 14B, the vertical driving voltage line VDL may be disposed on (or at) the second interlayer insulating layer 207, and the conductive line HCL may be disposed on (or at) the first organic insulating layer 211. The conductive line HCL may be connected to the vertical driving voltage line VDL through a ninth contact hole CT9 of the first organic insulating layer 211.

The embodiments described with reference to FIGS. 9, 11, and 13 may correspond to the embodiment corresponding to a region IX of FIG. 8. The structure of FIGS. 9, 11, and 13 is the structure on the left of the transmissive area TA (see, e.g., FIG. 8), and the structure on the right of the transmissive area TA (see, e.g., FIG. 8) may be symmetric to the structure described with reference to FIGS. 9, 11, and 13. In other words, the left and right may have a symmetrical structure with respect to an imaginary line IML (see, e.g., FIG. 8) passing through the center of the transmissive area TA of FIG. 8 and extending in the second direction (e.g., the y direction).

Figure 15:
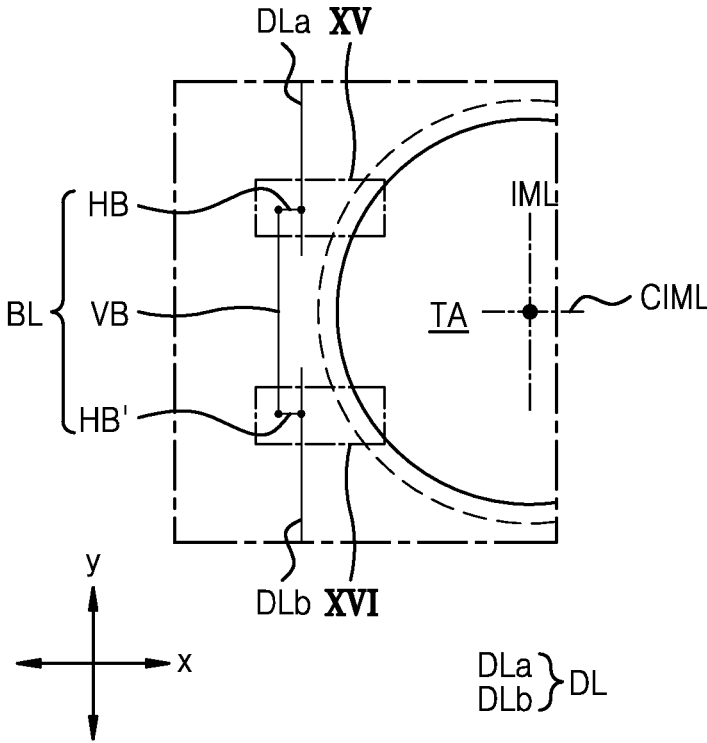
FIG. 15 is a plan view of a portion of the display panel around the transmission area according to one or more embodiments of the present disclosure.
Figure 16:
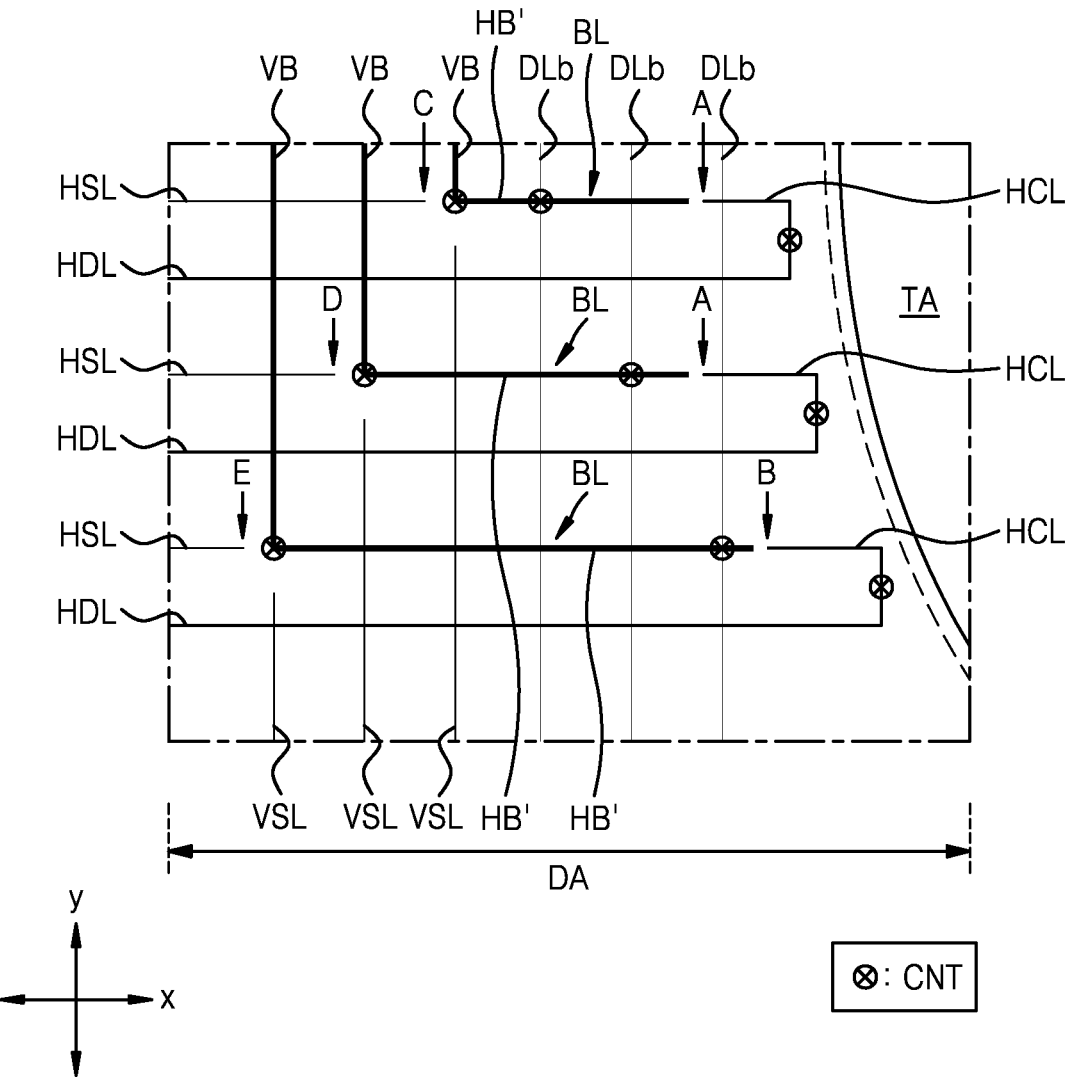
FIG. 16 is an enlarged plan view of a region XVI of FIG. 15.

FIG. 15 is a plan view of a portion of the display panel around the transmission area TA according to one or more embodiments of the present disclosure, and FIG. 16 is an enlarged plan view of a region XVI of FIG. 15.

Referring to FIG. 15, the data line DL around the transmissive area TA may include a first part DLa and a second part DLb separated or apart from each other as described, for example, with reference to FIG. 8. The first part DLa of the data line DL may be electrically connected to the second part DLb through a bridge line BL, and the bridge line BL may include a vertical bridge part VB and two horizontal bridge parts HB and HB' as described, for example, with reference to FIG. 8. The bridge line BL shown in FIG. 15 may be apart (or separated) from the conductive line HCL as shown in FIG. 16.

Referring to FIG. 16, each conductive line HCL may be electrically connected to the horizontal driving voltage line HDL as described, for example, with reference to FIG. 9. One end of the horizontal driving voltage line HDL may be electrically connected to the conductive line HCL around the transmissive area TA, and another end may extend toward one edge (e.g., the second edge in FIG. 3) of the display area DA. Referring to FIGS. 3 and 16, the other end of the horizontal driving voltage line HDL may be located in the second non-display area NDA2 (see, e.g., FIG. 3) beyond one edge (e.g., the second edge in FIG. 3) of the display area DA.

The position of one end of the conductive line HCL may be different. With regard to this, it is shown in FIG. 16 that one end of some conductive line HCL is located at a point "A," and one end of another conductive line HCL is located at a point "B." Referring to FIGS. 15 and 16, the point "B" may be closer to the imaginary line IML passing through the center of the transmissive area TA than the point "A." In other words, a distance from the point "B" to the imaginary line IML in the horizontal direction may be less than a distance from the point "A" to the imaginary line IML in the horizontal direction.

The horizontal common voltage line HSL arranged around the transmissive area TA may be arranged on (or at) the same row as the conductive line HCL. The horizontal common voltage line HSL arranged around the transmissive area TA may be separated or apart from the conductive line HCL. One end of the horizontal common voltage line HSL arranged around the transmissive area TA may extend toward the transmissive area TA, and be adjacent to one end of the horizontal bridge part HB', and another end of the horizontal common voltage line HSL may be electrically connected to the first auxiliary common voltage supply line 1021 as described, for example, with reference to FIG. 3.

The position of the other end of the horizontal common voltage line HSL may be different. With regard to this, it is shown in FIG. 16 that the other end of one horizontal common voltage line HSL is located at a point "C," the other end of another horizontal common voltage line HSL is located at a point "D," and the other end of another horizontal common voltage line HSL is located at a point "E." The point "C," the point "D," and the point "E" may be located on an imaginary line in a diagonal direction oblique to the x direction and the y direction.

The horizontal bridge part HB' of the bridge line BL may be located between the conductive line HCL and the horizontal common voltage line HSL. The horizontal bridge part HB' of the bridge line BL may be apart (or separated) from each of the conductive line HCL and the horizontal common voltage line HSL arranged on (or at) the same row. In other words, one end of the horizontal bridge part HB' may be adjacent to the conductive line HCL and apart (or separated) from the conductive line HCL, and another end of the horizontal bridge part HB' may be adjacent to the horizontal common voltage line HSL and apart (or separated) from the horizontal common voltage line HSL.

The position of one end of the horizontal bridge part HB' may be different. With regard to this, it is shown in FIG. 16 that one end of some horizontal bridge part HB' among the horizontal bridge parts HB' is adjacent to the point "A," and one end of another horizontal bridge part HB' is adjacent to the point "B."

The position of another end of the horizontal bridge part HB' may be different. With regard to this, it is shown in FIG. 16 that another end of one horizontal bridge part HB' is adjacent to the point "C," another end of another horizontal bridge part HB' is adjacent to the point "D," and another end of horizontal bridge part HB' is adjacent to the point "E."

The vertical common voltage line VSL may be disposed on (or at) the same column as the vertical bridge part VB, and apart (or separated) from the vertical bridge part VB. As shown in FIG. 16, because the lengths of the vertical bridge parts VB are different from each other, the lengths of the vertical common voltage lines VSL arranged on (or at) the same column as the vertical bridge parts VB may be different from each other. The vertical common voltage lines VSL may be electrically connected to at least one of the first common voltage input part 1011, the second common voltage input part 1012, and/or the third common voltage input part 1014 described, for example, with reference to FIG. 3.

The conductive line HCL, the horizontal bridge part HB', and the horizontal common voltage line HSL arranged around the transmissive area TA may be disposed on (or at) the same layer (e.g., the first organic insulating layer 211 described with reference to FIG. 7). The vertical bridge part VB, the vertical common voltage line VSL, and the second part DLb of the data line DL arranged around the transmissive area TA may be disposed on (or at) the same layer (e.g., the second organic insulating layer 212 described with reference to FIG. 7).

The vertical bridge part VB of each bridge line BL may be connected to the horizontal bridge part HB' through a contact hole CNT in an insulating layer (e.g., the second organic insulating layer 212 described with reference to FIG. 7) disposed between the horizontal bridge part HB' and the vertical bridge part VB. The second part DLb of the data line DL may be connected to the horizontal bridge part HB' through the contact hole CNT of the insulating layer (e.g., the second organic insulating layer 212 described with reference to FIG. 7) disposed between the second part DLb of the data line DL and the horizontal bridge part HB.

Though FIG. 16 describes a structure of a region XVI of FIG. 15, the present disclosure is not limited thereto. The structure of a region XV of FIG. 15 may be understood as a structure symmetrical to the structure described with reference to FIG. 16 with respect to an axis passing in an x-axis direction. In other words, the structure of the region XV of FIG. 15 may be symmetrical to the structure of the region XVI of FIG. 15, corresponding to FIG. 16 being symmetrical with respect to a horizontal imaginary line CIML. Here, the horizontal imaginary line CIML may correspond to an imaginary line passing through the center of the transmissive area TA and in the x direction. An upper structure of the transmissive area TA may be symmetrical to a lower structure with respect to the horizontal imaginary line CIML.

Though FIGS. 15 and 16 describe the left structure of the transmissive area TA, the relevant structure is equally applicable to the right of the transmissive area TA. As an example, when the structure described with reference to FIGS. 15 and 16 is symmetrical with respect to the virtual line IML, it may become a structure on the right of the transmission area TA. That is, a left structure of the transmissive area TA may be symmetrical to a right structure with respect to the imaginary line IML.

Though it is described in FIG. 16 that the conductive line HCL is electrically connected to the horizontal driving voltage line HDL as described above with reference to FIG. 9, the present disclosure is not limited thereto. In one or more embodiments, the conductive lines HCL of FIG. 16 may be electrically connected to the electrode voltage line CEL as described, for example, with reference to FIG. 11, or electrically connected to the vertical driving voltage line VDL as described, for example, with reference to FIG. 13.

According to one or more embodiments of the present disclosure, a display panel and an electronic apparatus including the same may be provided which may display high-quality images by reducing the area of a dead space and protecting the display panel from electrostatic discharge. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display panel comprising:
a transmissive area;
a display area around the transmissive area;
a plurality of light-emitting diodes in the display area;
a plurality of sub-pixel circuits electrically connected to the plurality of light-emitting diodes, respectively, and located in the display area, wherein each of the plurality of sub-pixel circuits comprises:
a switching transistor electrically connected to a scan line that extends in a first direction, and a data line that extends in a second direction crossing the first direction;
a driving transistor electrically connected to the switching transistor; and
a storage capacitor electrically connected to the driving transistor; and
a conductive line extending in the first direction across a first sub-pixel circuit arranged closest to the transmissive area relative to other sub-pixel circuits of the plurality of sub-pixel circuits across which the conductive line extends,
wherein an end of the conductive line is electrically connected to an end of a voltage line passing across the first sub-pixel circuit.

2. The display panel of claim 1, wherein the voltage line comprises a horizontal driving voltage line extending in the first direction across the first sub-pixel circuit.

3. The display panel of claim 2, wherein the conductive line is at a same layer as the horizontal driving voltage line, and is connected as an integrated body with the horizontal driving voltage line.

4. The display panel of claim 3, further comprising a first organic insulating layer on the storage capacitor,
wherein the voltage line and the horizontal driving voltage line are on the first organic insulating layer.

5. The display panel of claim 3, wherein a connection portion of the conductive line and the horizontal driving voltage line is adjacent to the transmissive area.

6. The display panel of claim 1, wherein the conductive line is at a layer different from a layer at which the voltage line is located.

7. The display panel of claim 6, wherein the storage capacitor comprises a first capacitor electrode and a second capacitor electrode, wherein the first capacitor electrode overlaps a driving semiconductor of the driving transistor, and the second capacitor electrode overlaps the first capacitor electrode and is located over the first capacitor electrode, and
wherein the voltage line comprises an electrode voltage line extending in the first direction, and a portion of the electrode voltage line is the second capacitor electrode.

8. The display panel of claim 7, further comprising a conductive metal between a portion of the conductive line and a portion of the electrode voltage line,
wherein the portion of the conductive line is electrically connected to the portion of the electrode voltage line by the conductive metal.

9. The display panel of claim 6, wherein the voltage line comprises a vertical driving voltage line extending in the second direction across the first sub-pixel circuit.

10. The display panel of claim 9, further comprising a first organic insulating layer between the conductive line and the vertical driving voltage line,
wherein the conductive line is on the first organic insulating layer, and the vertical driving voltage line is under the first organic insulating layer.

11. The display panel of claim 10, wherein the conductive line is connected to the vertical driving voltage line through a contact hole in the first organic insulating layer near the transmissive area.

12. An electronic apparatus comprising:
a display panel comprises a transmissive area and a display area around the transmissive area; and
a component below a rear surface of the display panel and corresponding to the transmissive area,
wherein the display panel comprises:
a plurality of light-emitting diodes in the display area;
a plurality of sub-pixel circuits electrically connected to the plurality of light-emitting diodes, respectively, and arranged in the display area, wherein each of the plurality of sub-pixel circuits comprises:
a switching transistor electrically connected to a scan line that extends in a first direction, and a data line that extends in a second direction crossing the first direction;
a driving transistor electrically connected to the switching transistor; and
a storage capacitor electrically connected to the driving transistor and comprising a first capacitor electrode and a second capacitor electrode; and
a conductive line extending in the first direction across a first sub-pixel circuit arranged closest to the transmissive area relative to other sub-pixel circuits of the plurality of sub-pixel circuits across which the conductive line extends,
wherein an end of the conductive line is electrically connected to an end of a voltage line passing across the first sub-pixel circuit.

13. The electronic apparatus of claim 12, wherein the display panel comprising:
a horizontal driving voltage line extending in the first direction and passing across the first sub-pixel circuit;
a vertical driving voltage line extending in the second direction and passing across the first sub-pixel circuit; and an electrode voltage line extending in the first direction and comprising the second capacitor electrode of the storage capacitor.

14. The electronic apparatus of claim 13, wherein the horizontal driving voltage line crosses a portion of the vertical driving voltage line, and the vertical driving voltage line crosses a portion of the electrode voltage line.

15. The electronic apparatus of claim 14, wherein the horizontal driving voltage line is connected to the vertical driving voltage line through a contact hole in an insulating layer between the horizontal driving voltage line and the vertical driving voltage line, and the vertical driving voltage line is connected to the electrode voltage line through a contact hole in an insulating layer between the vertical driving voltage line and the electrode voltage line.

16. The electronic apparatus of claim 13, wherein the voltage line comprises the horizontal driving voltage line, and the conductive line is at a same layer as the horizontal driving voltage line and connected as an integrated body with the horizontal driving voltage line.

17. The electronic apparatus of claim 16, wherein a connection portion of the conductive line and the horizontal driving voltage line is adjacent to the transmissive area.

18. The electronic apparatus of claim 13, wherein the voltage line comprises the electrode voltage line.

19. The electronic apparatus of claim 18, wherein the display panel further comprises a conductive metal between a portion of the conductive line and a portion of the electrode voltage line, wherein the portion of the conductive line is electrically connected to the portion of the electrode voltage line by the conductive metal.

20. The electronic apparatus of claim 13, wherein the voltage line comprises the vertical driving voltage line.

21. The electronic apparatus of claim 20, wherein the conductive line is connected to the vertical driving voltage line through a contact hole in an insulating layer between the conductive line and the vertical driving voltage line near the transmissive area.

22. The electronic apparatus of claim 12, wherein the component comprises a sensor or a camera.

23. An electronic apparatus comprising:

a display panel comprising a transmissive area and a display area around the transmissive area; and a component below a rear surface of the display panel and corresponding to the transmissive area, wherein the display panel comprises:

a plurality of light-emitting diodes located in the display area;

a plurality of sub-pixel circuits electrically connected to the plurality of light-emitting diodes, respectively, and in the display area, wherein each of the plurality of sub-pixel circuits comprises:

a switching transistor electrically connected to a scan line that extends in a first direction, and electrically connected to a data line that extends in a second direction crossing the first direction;

a driving transistor electrically connected to the switching transistor; and a storage capacitor electrically connected to the driving transistor and comprising a first capacitor electrode and a second capacitor electrode;

two conductive lines on two opposite sides of the transmissive area, respectively, and spaced apart from each other by the transmissive area therebetween; and two voltage lines on two opposite sides of the transmissive area, respectively, and spaced apart from each other by the transmissive area therebetween, wherein the two conductive lines are electrically connected to the two voltage lines, respectively.

24. The electronic apparatus of claim 23, wherein a first conductive line of the two conductive lines on one side of the transmissive area passes across a first sub-pixel circuit that is nearer the transmissive area than other sub-pixel circuits of the plurality of sub-pixel circuits, and a first voltage line electrically connected to the first conductive line passes across the first sub-pixel circuit in the first direction or in the second direction.

25. The electronic apparatus of claim 24, wherein the display panel further comprises:

a horizontal driving voltage line extending in the first direction and passing across the first sub-pixel circuit;

a vertical driving voltage line extending in the second direction and passing across the first sub-pixel circuit; and an electrode voltage line extending in the first direction and comprising the second capacitor electrode of the storage capacitor.

26. The electronic apparatus of claim 25, wherein the horizontal driving voltage line crosses a portion of the vertical driving voltage line, and the vertical driving voltage line crosses a portion of the electrode voltage line.

27. The electronic apparatus of claim 26, wherein the horizontal driving voltage line is connected to the vertical driving voltage line through a contact hole in an insulating layer between the horizontal driving voltage line and the vertical driving voltage line, and the vertical driving voltage line is connected to the electrode voltage line through a contact hole in another insulating layer between the vertical driving voltage line and the electrode voltage line.

28. The electronic apparatus of claim 25, wherein the first voltage line comprises the horizontal driving voltage line, and the first conductive line is at a same layer as the horizontal driving voltage line and connected as an integrated body with the horizontal driving voltage line.

29. The electronic apparatus of claim 25, wherein the first voltage line comprises the electrode voltage line.

30. The electronic apparatus of claim 29, wherein the display panel further comprises a conductive metal between a portion of the first conductive line and a portion of the electrode voltage line, wherein the portion of the first conductive line is electrically connected to the portion of the electrode voltage line by the conductive metal.

31. The electronic apparatus of claim 25, wherein the first voltage line comprises the vertical driving voltage line.

32. The electronic apparatus of claim 31, wherein the first conductive line is connected to the vertical driving voltage line through a contact hole in an insulating layer between the first conductive line and the vertical driving voltage line near the transmissive area.

33. The electronic apparatus of claim 23, wherein the component comprises a sensor or a camera.

* * * * *